(12) United States Patent
Cheng et al.

(10) Patent No.: US 12,368,053 B2
(45) Date of Patent: Jul. 22, 2025

(54) METHOD FOR LASER DRILLING PROCESS FOR AN INTEGRATED CIRCUIT PACKAGE

(71) Applicant: Taiwan Semiconductor Manufacturing Co., Ltd., Hsinchu (TW)

(72) Inventors: Chia-Shen Cheng, Zhubei (TW); Chia-Lun Chang, Tainan (TW); Hao-Jan Pei, Hsinchu (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 572 days.

(21) Appl. No.: 17/661,940

(22) Filed: May 4, 2022

(65) Prior Publication Data
US 2023/0230849 A1    Jul. 20, 2023

Related U.S. Application Data

(60) Provisional application No. 63/267,324, filed on Jan. 31, 2022, provisional application No. 63/266,480, filed on Jan. 6, 2022.

(51) Int. Cl.
| | |
|---|---|
| H01L 21/48 | (2006.01) |
| B23K 26/382 | (2014.01) |
| H01L 23/00 | (2006.01) |
| H01L 25/10 | (2006.01) |
| B23K 101/40 | (2006.01) |
| H01L 25/065 | (2023.01) |

(52) U.S. Cl.
CPC .......... H01L 21/481 (2013.01); B23K 26/382 (2015.10); H01L 21/4853 (2013.01);
(Continued)

(58) Field of Classification Search
CPC ... B23K 26/382; B23K 2101/40; H01L 24/97; H01L 2224/92244; H01L 2224/97
(Continued)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

FOREIGN PATENT DOCUMENTS

| | | | | |
|---|---|---|---|---|
| CN | 103383923 A | * | 11/2013 | ........... H01L 21/561 |
| KR | 20090104003 A | | 10/2009 | |

(Continued)

*Primary Examiner* — Phuc T Dang
(74) *Attorney, Agent, or Firm* — Slater Matsil, LLP

(57) ABSTRACT

A method includes forming an insulating layer over a package. The package has a plurality of locations where openings are subsequently formed. A first laser shot is performed, location by location, on each of the locations across the package. A first laser spot of the first laser shot overlaps with each of the locations. The first laser shot removes a first portion of the insulating layer below the first laser spot. Another laser shot is performed, location by location, on each of the locations across the package. Another laser spot of the another laser shot overlaps with each of the locations. The another laser shot removes another portion of the insulating layer below the another laser spot. Performing the another laser shot, location by location, on each of the locations across the package is repeated multiple times, until desired portions of the insulating layer are removed.

20 Claims, 37 Drawing Sheets

(52) U.S. Cl.
CPC .............. *H01L 24/24* (2013.01); *H01L 24/32* (2013.01); *H01L 25/105* (2013.01); *B23K 2101/40* (2018.08); *H01L 24/73* (2013.01); *H01L 24/82* (2013.01); *H01L 24/92* (2013.01); *H01L 24/96* (2013.01); *H01L 24/97* (2013.01); *H01L 25/0655* (2013.01); *H01L 25/0657* (2013.01); *H01L 2224/24137* (2013.01); *H01L 2224/32225* (2013.01); *H01L 2224/73267* (2013.01); *H01L 2224/82106* (2013.01); *H01L 2224/92244* (2013.01); *H01L 2224/95001* (2013.01); *H01L 2224/96* (2013.01); *H01L 2224/97* (2013.01); *H01L 2225/0651* (2013.01); *H01L 2225/1035* (2013.01); *H01L 2225/1058* (2013.01)

(58) Field of Classification Search
USPC .......................................................... 257/459
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2002/0170891 A1 | 11/2002 | Boyle et al. | |
| 2008/0076267 A1* | 3/2008 | Oishi | G02F 1/1368 438/785 |
| 2010/0099239 A1 | 4/2010 | Dunne et al. | |
| 2011/0177674 A1 | 7/2011 | Rodin et al. | |
| 2018/0162142 A1 | 6/2018 | Kucera et al. | |
| 2020/0008305 A1 | 1/2020 | Clark | |
| 2020/0176432 A1 | 6/2020 | Huang et al. | |
| 2020/0253051 A1* | 8/2020 | Tay | H05K 1/186 |
| 2021/0020574 A1 | 1/2021 | Yu et al. | |
| 2021/0127478 A1 | 4/2021 | Feng et al. | |
| 2021/0202453 A1 | 7/2021 | Chang et al. | |
| 2022/0344252 A1* | 10/2022 | Kang | H01L 23/3142 |

FOREIGN PATENT DOCUMENTS

| | | |
|---|---|---|
| KR | 20100136500 A | 12/2010 |
| KR | 20200001536 A | 1/2020 |
| TW | 202105626 A | 2/2021 |

\* cited by examiner

METHOD FOR LASER DRILLING PROCESS FOR AN INTEGRATED CIRCUIT PACKAGE

PRIORITY CLAIM AND CROSS-REFERENCE

This application claims the benefit of U.S. Provisional Application No. 63/266,480, filed on Jan. 6, 2022, and U.S. Provisional Application No. 63/267,324, filed on Jan. 31, 2022, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
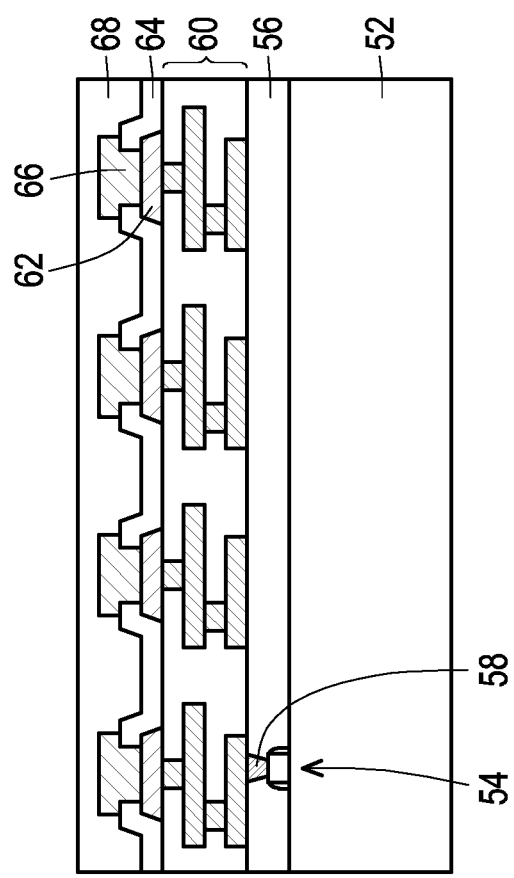
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a laser drilling process performed on a package, such as a stacked integrated fan-out (InFO) package. The laser drilling process described herein may be also used in any other applications where insulating layer patterning is performed. In some embodiments, a laser drilling process is performed such that time between two consecutive laser shots that are performed on a same location of a package is increased. In some embodiments when a laser drilling process is performed on a redistribution structure of a package to form openings exposing pads of the redistribution structure, the laser shots performed over a same pad are performed in different but overlapping locations, which allows for reducing number of laser shots that form the openings. Various embodiments presented herein as applied to a redistribution structure of a package allow for reducing heat accumulation on pads of the redistribution structure, reducing dendrite formation on the pads, reducing or avoiding delamination between pads and adjacent insulating layers, increasing wafer-per-hour (WPH) yield, and increasing pass rate for a reliability analysis (RA) torture test.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. In some embodiments, the interconnect structure 60 may be formed of alternating layers of dielectric (e.g., low-k dielectric material) and conductive (e.g., copper) materials with vias interconnecting the layers of the conductive material and may be formed through any suitable process (such as deposition, damascene, dual damascene, or the like). The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. In some embodiments, the passivation films 64 may comprise one or more layers of silicon oxide, silicon nitride, silicon oxynitride, the like, or combinations thereof, and may be formed using ALD, CVD, or the like. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62.

The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. The CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

An insulating layer 68 may (or may not) be on the active side of the integrated circuit die 50, such as on the passivation films 64 and the die connectors 66. The insulating layer 68 laterally encapsulates the die connectors 66, and the insulating layer 68 is laterally coterminous with the integrated circuit die 50. Initially, the insulating layer 68 may bury the die connectors 66, such that the topmost surface of the insulating layer 68 is above the topmost surfaces of the die connectors 66. In some embodiments where solder regions are disposed on the die connectors 66, the insulating layer 68 may bury the solder regions as well. Alternatively, the solder regions may be removed prior to forming the insulating layer 68. In some embodiments, the insulating layer 68 may comprise a photo-sensitive material, which may be a polymer, such as polybenzoxazole (PBO), polyimide, benzocyclobutene (BCB), or the like, that may be patterned using a lithography mask. In other embodiments, the insulating layer 68 may comprise a non-photo-sensitive material, which may be a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The insulating layer 68 may be formed, for example, by spin coating, lamination, CVD, or the like. In some embodiments, the die connectors 66 are exposed through the insulating layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2-14, 15A-15C, 16A, 16B, 18, 20-23, 25-28, and 30 illustrate top and cross-sectional views of intermediate steps during a process for forming a first package component 100 in accordance with some embodiments. A first package region $PKG_1$ and a second package region $PKG_2$ of the first package component 100 are illustrated, and one or more of the integrated circuit dies 50 are packaged to form an integrated circuit package in each of the package regions $PKG_1$ and $PKG_2$. The integrated circuit packages may also be referred to as integrated fan-out (InFO) packages. The first package component 100 may also be referred to as a wafer-level InFO package.

Figure 2:
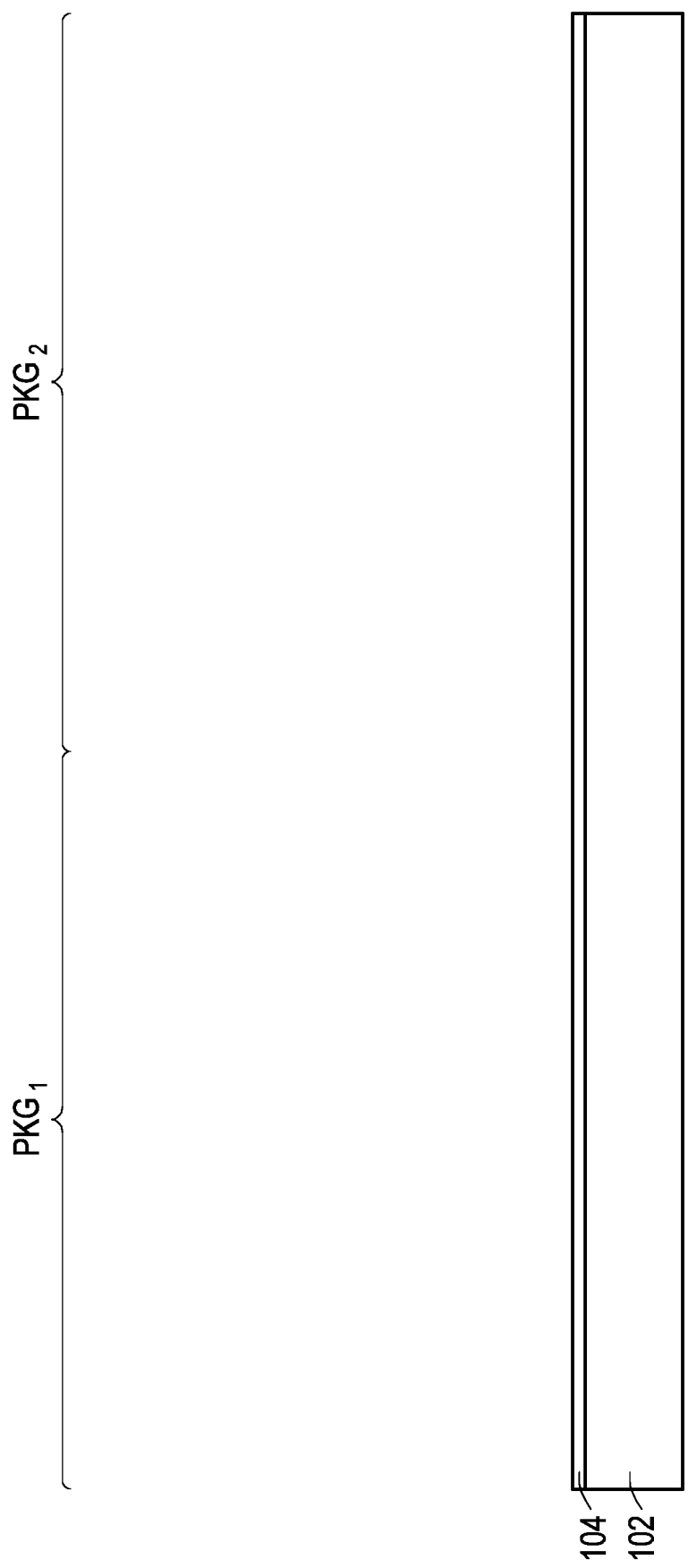
FIGS. 2-14, 15A-15C, 16A, 16B, 18, 20-23, 25-28, and 30 illustrate top and cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
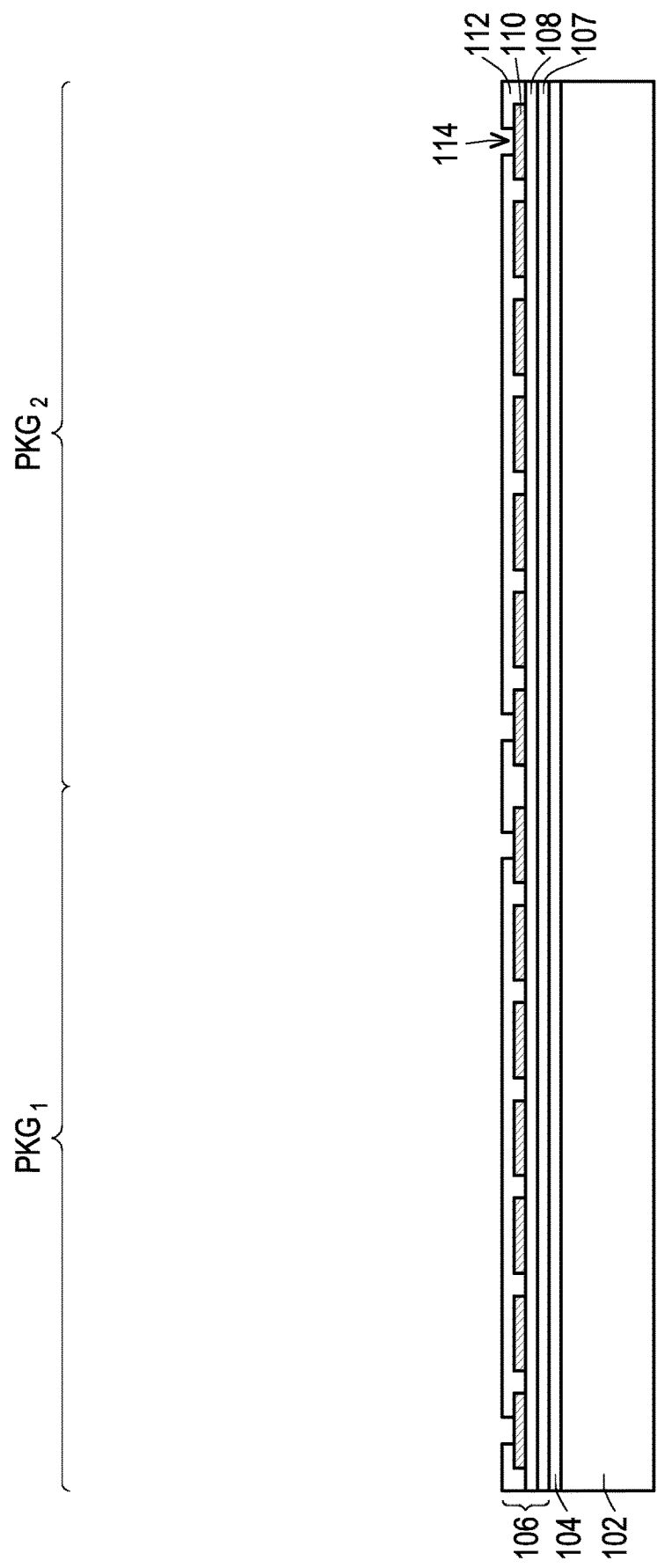

In FIG. 3, a back-side redistribution structure 106 may be formed on the release layer 104. In the embodiment shown, the back-side redistribution structure 106 includes insulating layers 107 and 108, a metallization pattern 110 (sometimes referred to as redistribution layers or redistribution lines), and an insulating layer 112. In some embodiments, an insulating layer without metallization patterns is formed on the release layer 104 in lieu of the back-side redistribution structure 106.

The insulating layers 107 and 108 may be formed on the release layer 104. The bottom surface of the insulating layer 107 may be in contact with the top surface of the release layer 104. In some embodiments, the insulating layers 107 and 108 may be formed using similar materials and methods as the insulating layer 68 described above with reference to FIG. 1, and the description is not repeated herein. In some embodiments, the insulating layers 107 and 108 comprise a same material. In other embodiments, the insulating layers 107 and 108 comprise different materials. In alternative embodiments, instead of forming the insulating layer 107 while forming the back-side redistribution structure 106, the insulating layer 107 may be formed after de-bonding a resulting packaged structure from the carrier substrate 102.

The metallization pattern 110 may be formed on the insulating layer 108. As an example to form metallization pattern 110, a seed layer is formed over the insulating layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The insulating layer 112 may be formed on the metallization pattern 110 and the insulating layer 108. In some embodiments, the insulating layer 112 may be formed using similar materials and methods as the insulating layer 68 described above with reference to FIG. 1, and the description is not repeated herein. In some embodiments, the insulating layers 107, 108 and 112 comprise a same material. In other embodiments, the insulating layers 107, 108 and 112 comprise different materials. The insulating layer 112 is then patterned to form openings 114 exposing portions of the metallization pattern 110. The patterning may be formed by an acceptable process, such as by exposing the insulating layer 112 to light when the insulating layer 112 is a photo-sensitive material, or by etching using, for example, an anisotropic etch when the insulating layer 112 is a non-photo-sensitive material. If the insulating layer 112 is a photo-sensitive material, the insulating layer 112 can be developed after the exposure.

FIG. 3 illustrates a redistribution structure 106 having a single metallization pattern 110 for illustrative purposes. In some embodiments, the back-side redistribution structure 106 may include any number of insulating layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying insulating layer and in the opening of the underlying insulating layer, thereby interconnecting and electrically coupling various conductive elements.

Figure 4:
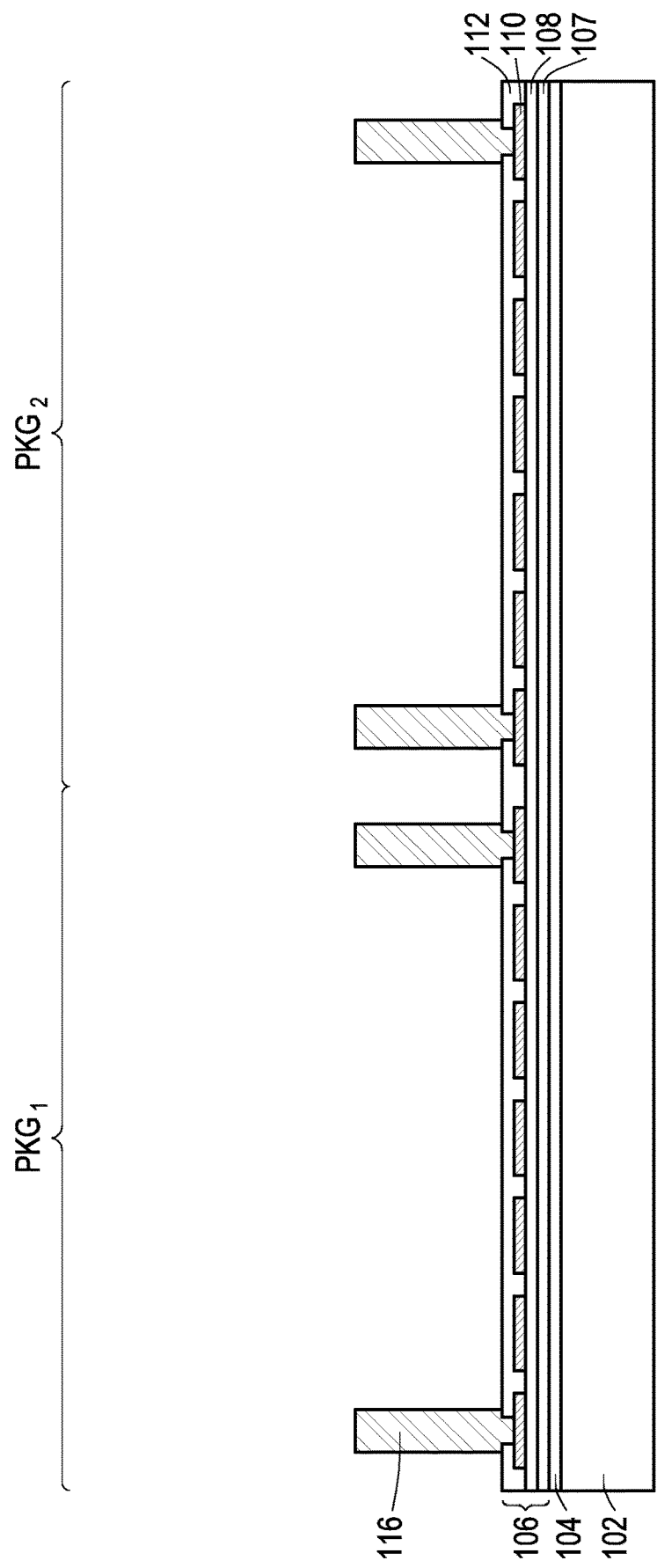

In FIG. 4, through vias 116 are formed in the openings 114 (see FIG. 3) and extending away from the topmost insulating layer of the back-side redistribution structure 106 (e.g., the insulating layer 112). As an example to form the through vias 116, a seed layer (not shown) is formed over the back-side redistribution structure 106, e.g., on the insulating layer 112 and portions of the metallization pattern 110 exposed by the openings 114 (see FIG. 3). In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
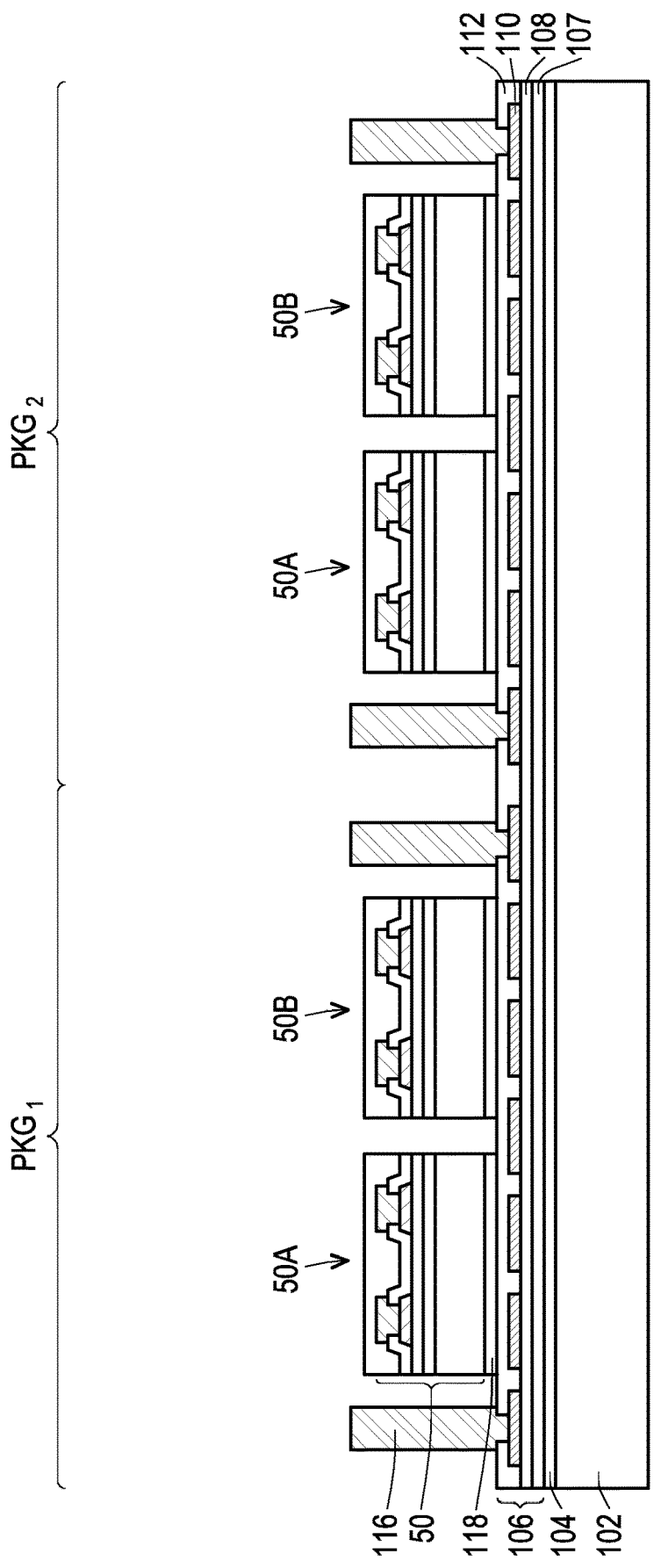

In FIG. 5, integrated circuit dies 50 (e.g., a first integrated circuit die 50A and a second integrated circuit die 50B) are adhered to the insulating layer 112 by an adhesive 118. A desired type and quantity of integrated circuit dies 50 are adhered in each of the package regions PKG$_1$ and PKG$_2$. In the embodiment shown, multiple integrated circuit dies 50 are adhered adjacent one another, including the first integrated circuit die 50A and the second integrated circuit die 50B, in each of the first package region PKG$_1$ and the second package region PKG$_2$. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region PKG$_1$ and the second package region PKG$_2$ may be limited, particularly when the integrated circuit dies 50 include devices with a large footprint, such as SoCs. Use of the back-side redistribution structure 106 allows for an improved interconnect arrangement when the first package region PKG$_1$ and the second package region PKG$_2$ have limited space available for the through vias 116.

The adhesive 118 is on back-sides of the integrated circuit dies 50 and adheres the integrated circuit dies 50 to the back-side redistribution structure 106, such as to the insulating layer 112. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure 106 is utilized, or may be applied to an upper surface of the back-side redistribution structure 106, if applicable. For example, the adhesive 118 may be applied to the back-sides of the integrated circuit dies 50 before singulating to separate the integrated circuit dies 50.

Figure 6:
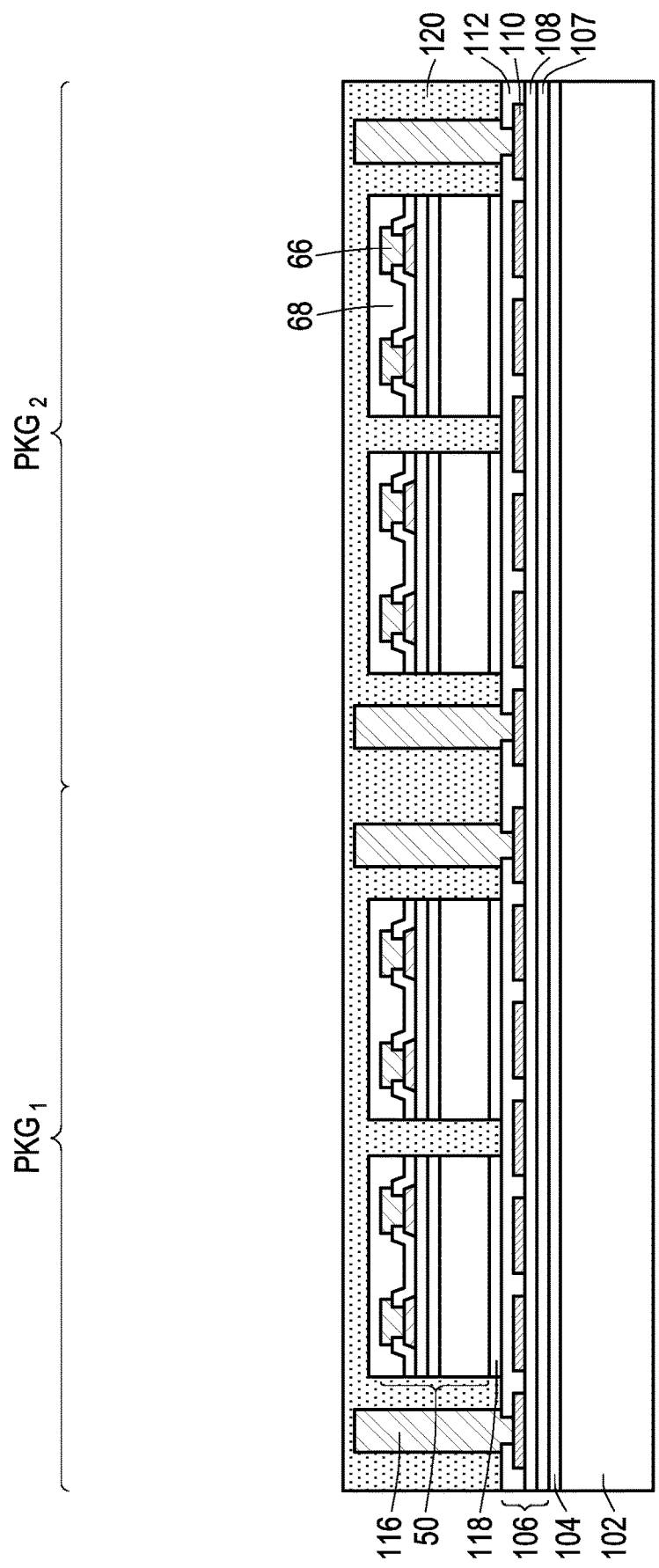

In FIG. 6, an encapsulant 120 is formed on and around the various components. After formation, the encapsulant 120 encapsulates the through vias 116 and the integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

Figure 7:
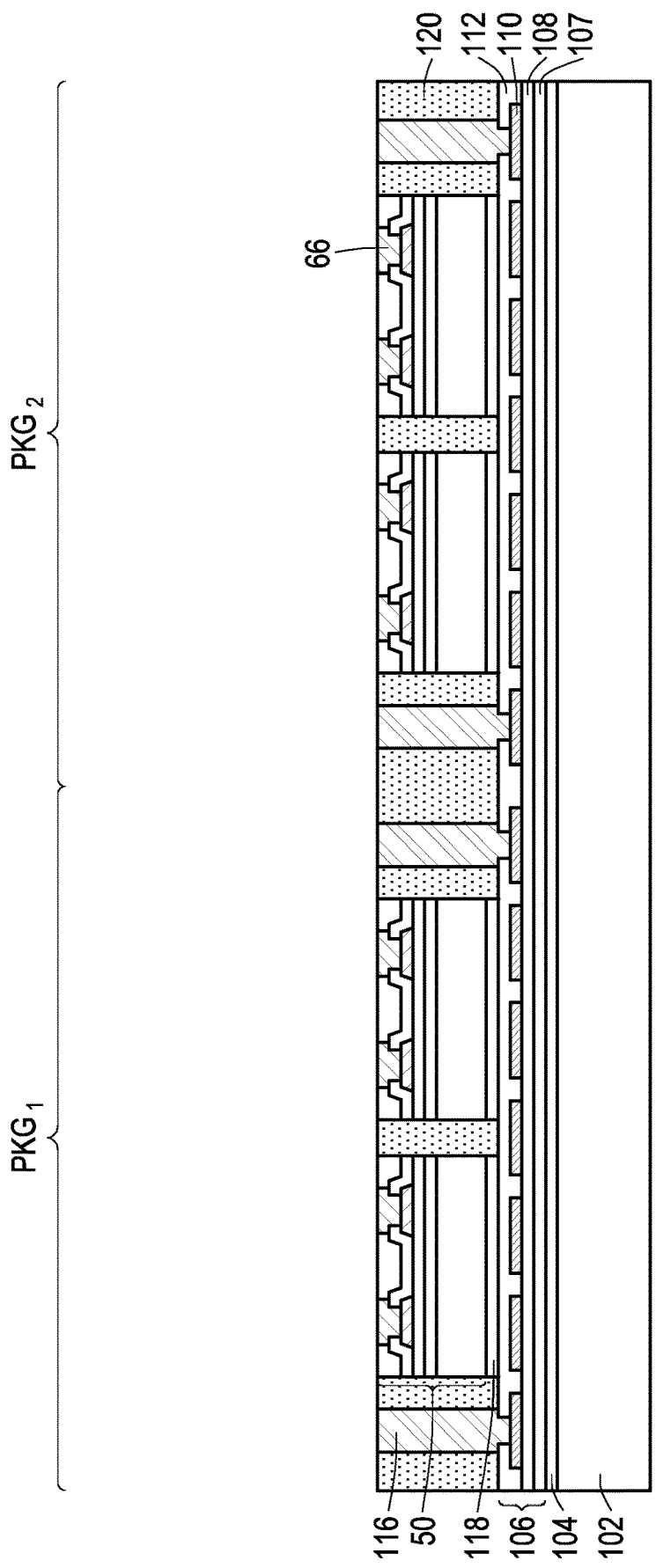

In FIG. 7, a planarization process is performed on the encapsulant 120 to expose the through vias 116 and the die connectors 66. The planarization process may also remove material of the through vias 116, the insulating layer 68, and/or the die connectors 66 until the die connectors 66 and the through vias 116 are exposed. After performing the planarization process, top surfaces of the through vias 116, the die connectors 66, the insulating layer 68, and the encapsulant 120 are substantially coplanar or level within process variations of the planarization process. The planarization process may be, for example, a chemical-mechanical polish (CMP), a grinding process, an etch process, or the like. In some embodiments, the planarization process may be omitted, for example, if the through vias 116 and/or the die connectors 66 are already exposed.

In FIGS. 8-11, a front-side redistribution structure 122 (see FIG. 11) is formed over the encapsulant 120, the through vias 116, and the integrated circuit dies 50. The front-side redistribution structure 122 includes insulating layers 124, 128, 132, and 136; and metallization patterns 126, 130, and 134. The metallization patterns may also be referred to as redistribution layers or redistribution lines. The front-side redistribution structure 122 is shown, as an example, having three layers of metallization patterns. More or fewer insulating layers and metallization patterns may be formed in the front-side redistribution structure 122. If fewer insulating layers and metallization patterns are to be formed, steps and processes discussed below may be omitted. If more insulating layers and metallization patterns are to be formed, steps and processes discussed below may be repeated.

Figure 8:
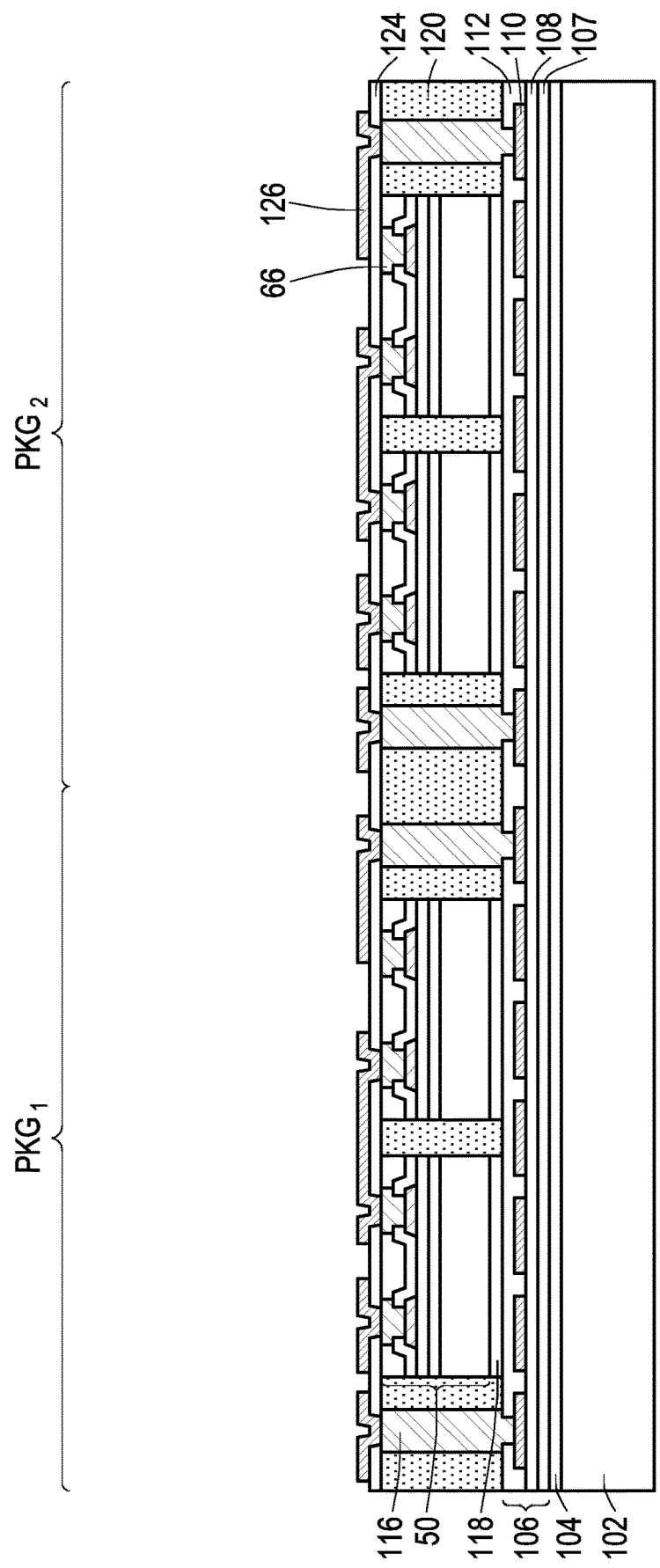

In FIG. 8, the insulating layer 124 is deposited on the encapsulant 120, the through vias 116, and the die connectors 66. In some embodiments, the insulating layer 124 is formed of a photo-sensitive material, which may be a polymer, such as PBO, polyimide, BCB, or the like, which may be patterned using a lithography mask. The insulating layer 124 may be formed by spin coating, lamination, CVD, the like, or a combination thereof. The insulating layer 124 is then patterned. The patterning forms openings exposing portions of the through vias 116 and the die connectors 66. The patterning may be by an acceptable process, such as by exposing and developing the insulating layer 124 to light when the insulating layer 124 is a photo-sensitive material, or by etching using, for example, an anisotropic etch.

The metallization pattern 126 is then formed. The metallization pattern 126 includes conductive elements extending along the major surface of the insulating layer 124 and extending through the insulating layer 124 to physically and electrically couple to the through vias 116 and the integrated circuit dies 50. As an example to form the metallization pattern 126, a seed layer is formed over the insulating layer 124 and in the openings extending through the insulating layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 9:
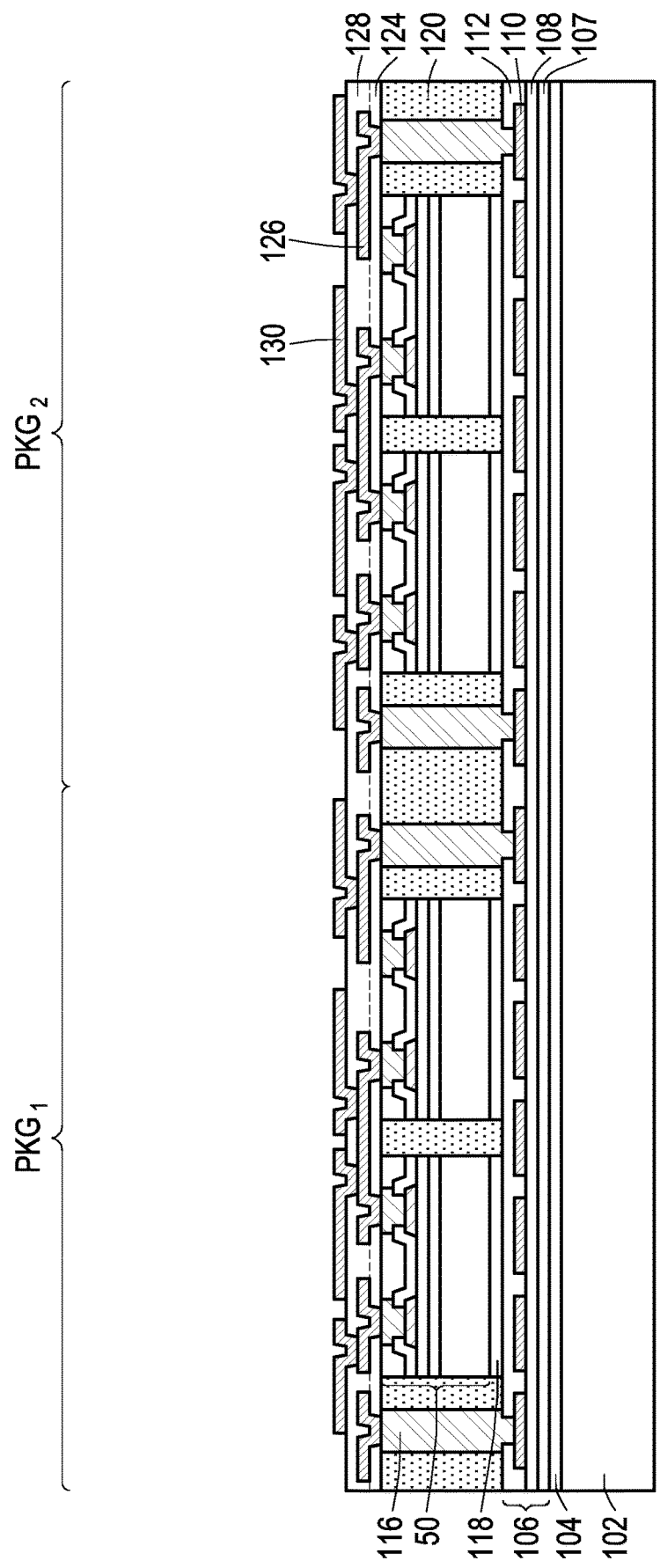

In FIG. 9, the insulating layer 128 is deposited on the metallization pattern 126 and the insulating layer 124. The insulating layer 128 may be formed in a similar manner and of a similar material as the insulating layer 124. The metallization pattern 130 is then formed. The metallization pattern 130 includes portions on and extending along the major surface of the insulating layer 128. The metallization pattern 130 further includes portions extending through the insulating layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 10:
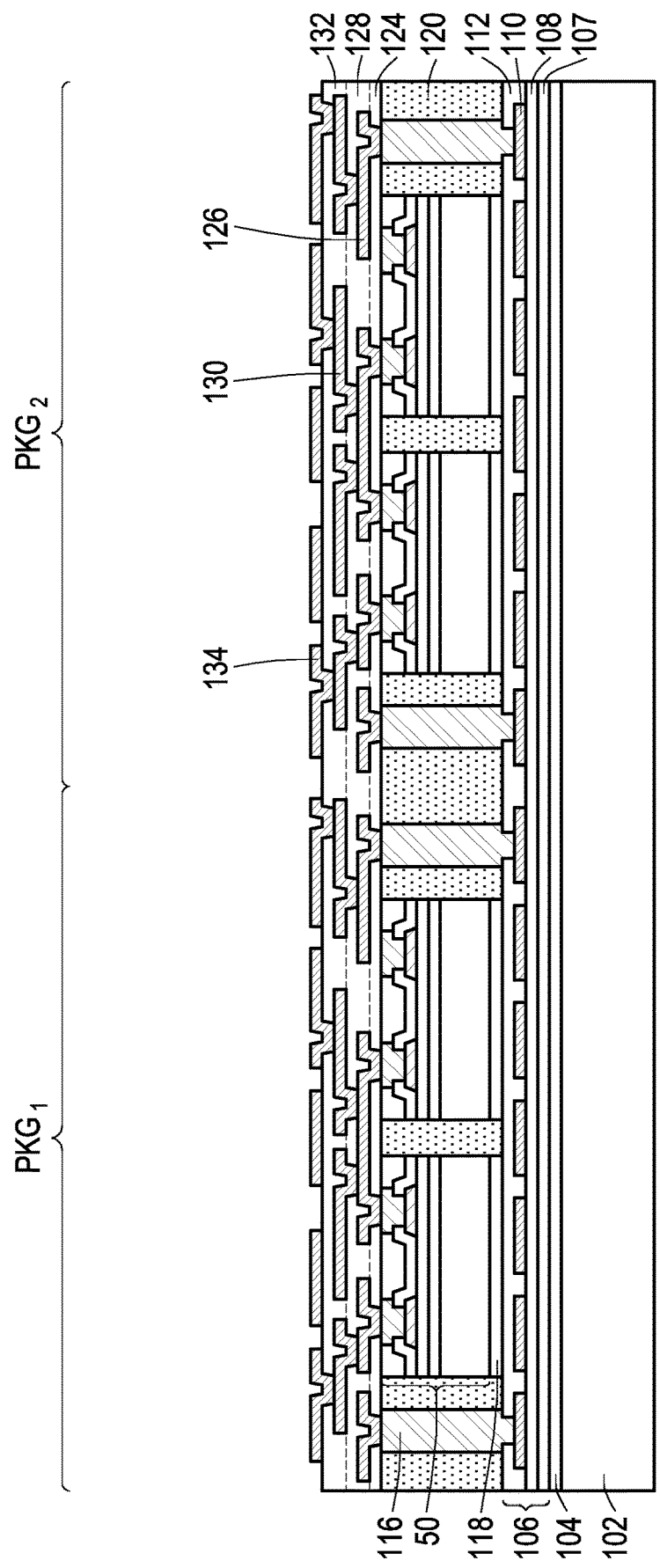

In FIG. 10, the insulating layer 132 is deposited on the metallization pattern 130 and the insulating layer 128. The insulating layer 132 may be formed in a similar manner and of a similar material as the insulating layer 124. The metallization pattern 134 is then formed. The metallization pattern 134 includes portions on and extending along the major surface of the insulating layer 132. The metallization pattern 134 further includes portions extending through the insulating layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 11:
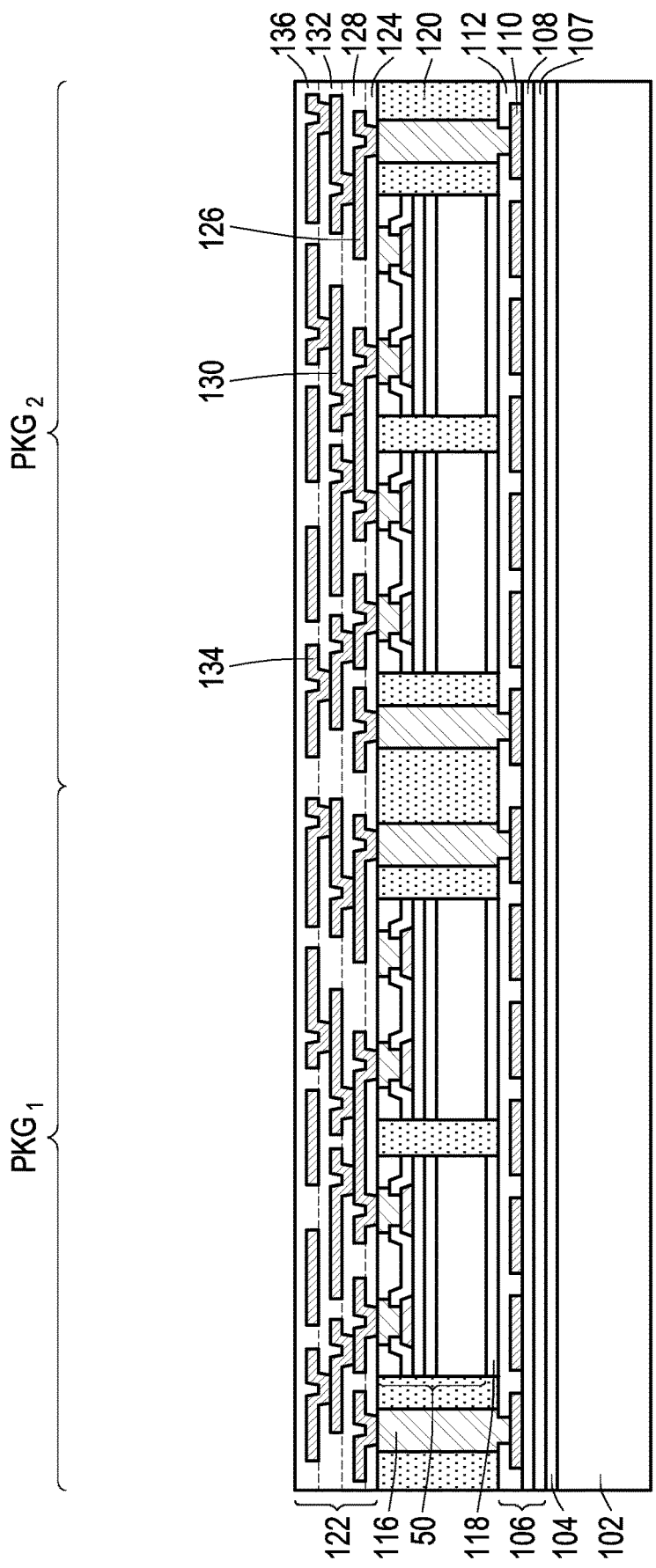

In FIG. 11, the insulating layer 136 is deposited on the metallization pattern 134 and the insulating layer 132. The insulating layer 136 may be formed in a similar manner and of a similar material as the insulating layer 124. The insulating layer 136 is the topmost insulating layer of the front-side redistribution structure 122. As such, all of the metallization patterns of the front-side redistribution structure 122 (e.g., the metallization patterns 126, 130, and 134) are disposed between the insulating layer 136 and the integrated circuit dies 50. Further, all of the intermediate insulating layers of the front-side redistribution structure 122 (e.g., the insulating layers 124, 128, 132) are disposed between the insulating layer 136 and the integrated circuit dies 50.

Figure 12:
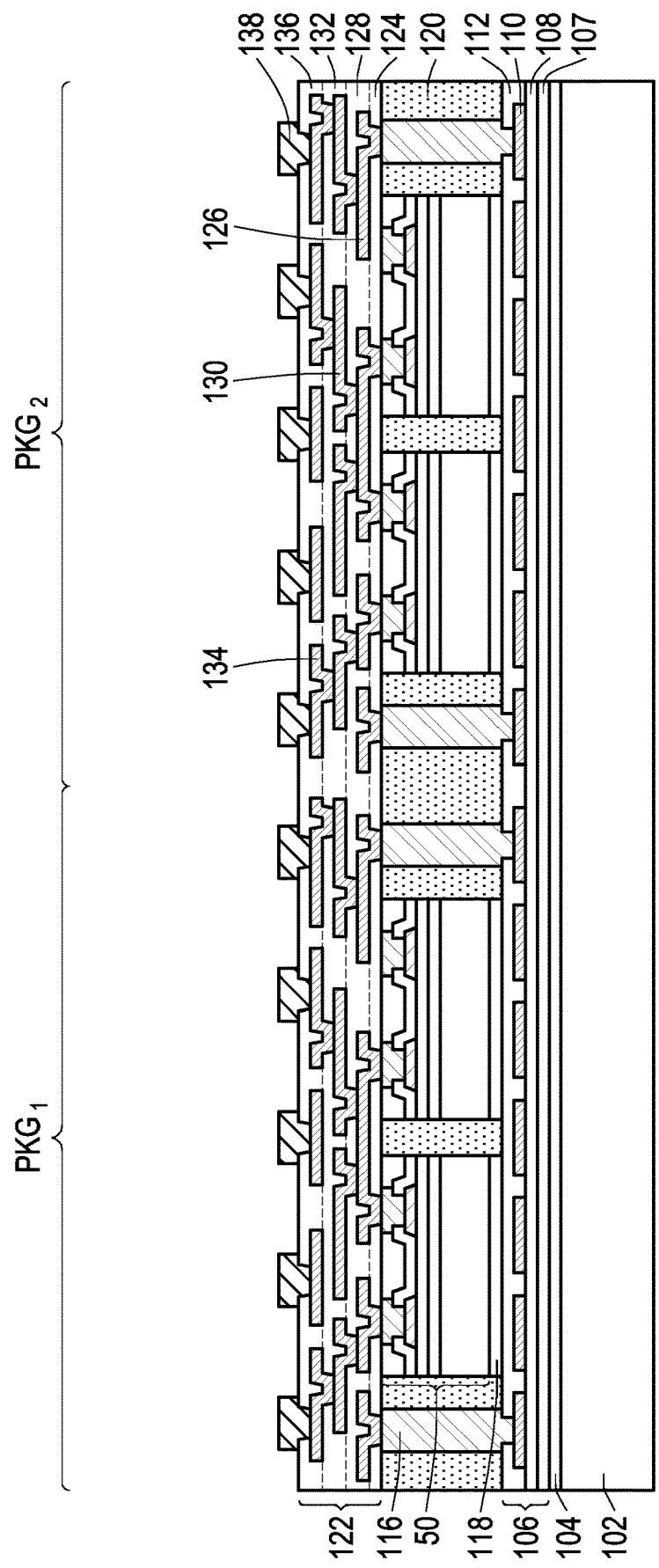

In FIG. 12, UBMs 138 are formed for external connection to the front-side redistribution structure 122. The UBMs 138 have bump portions on and extending along the major surface of the insulating layer 136, and have via portions extending through the insulating layer 136 to physically and electrically couple the metallization pattern 134. As a result, the UBMs 138 are electrically coupled to the through vias 116 and the integrated circuit dies 50. In some embodiments, the UBMs 138 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 138. Any suitable materials or layers of material that may be used for the UBMs 138 are fully intended to be included within the scope of the current application. In some embodiments, the UBMs 138 have a different size than the metallization patterns 126, 130, and 134.

Figure 13:
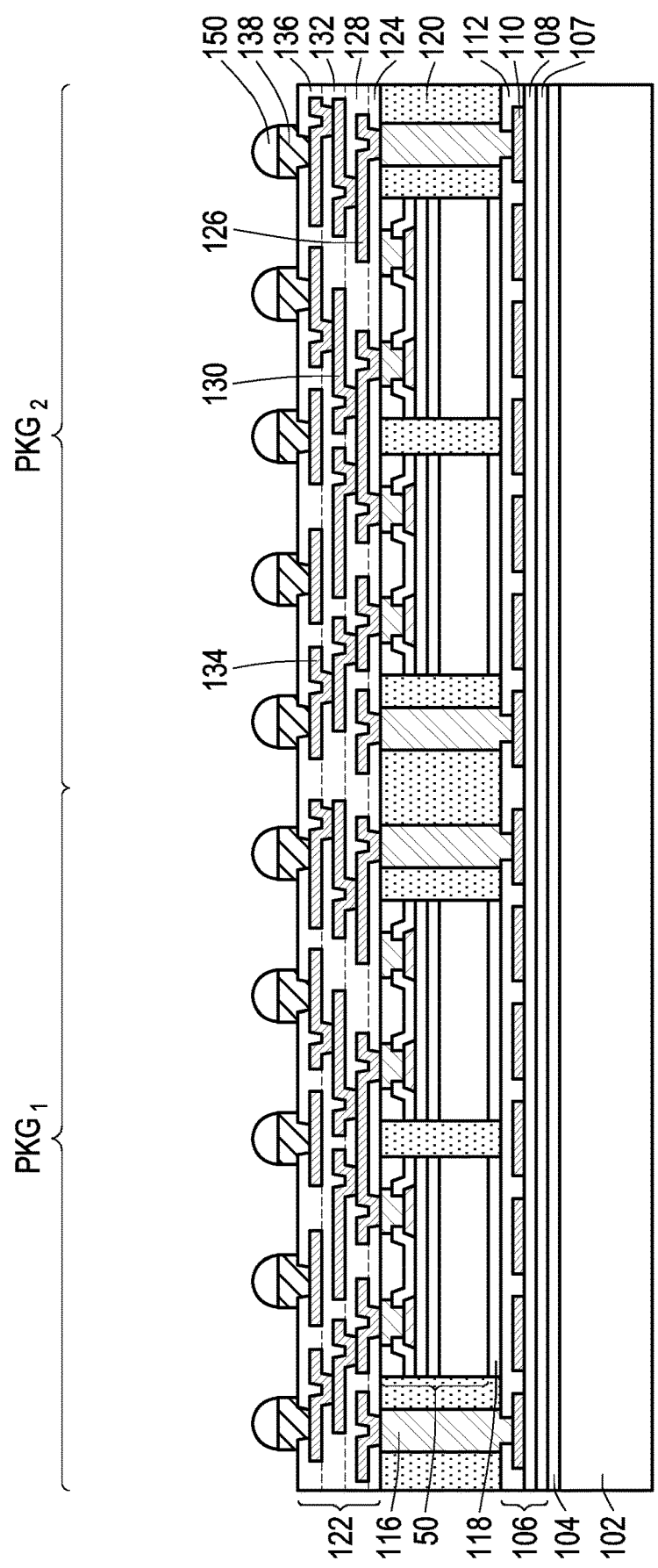

In FIG. 13, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
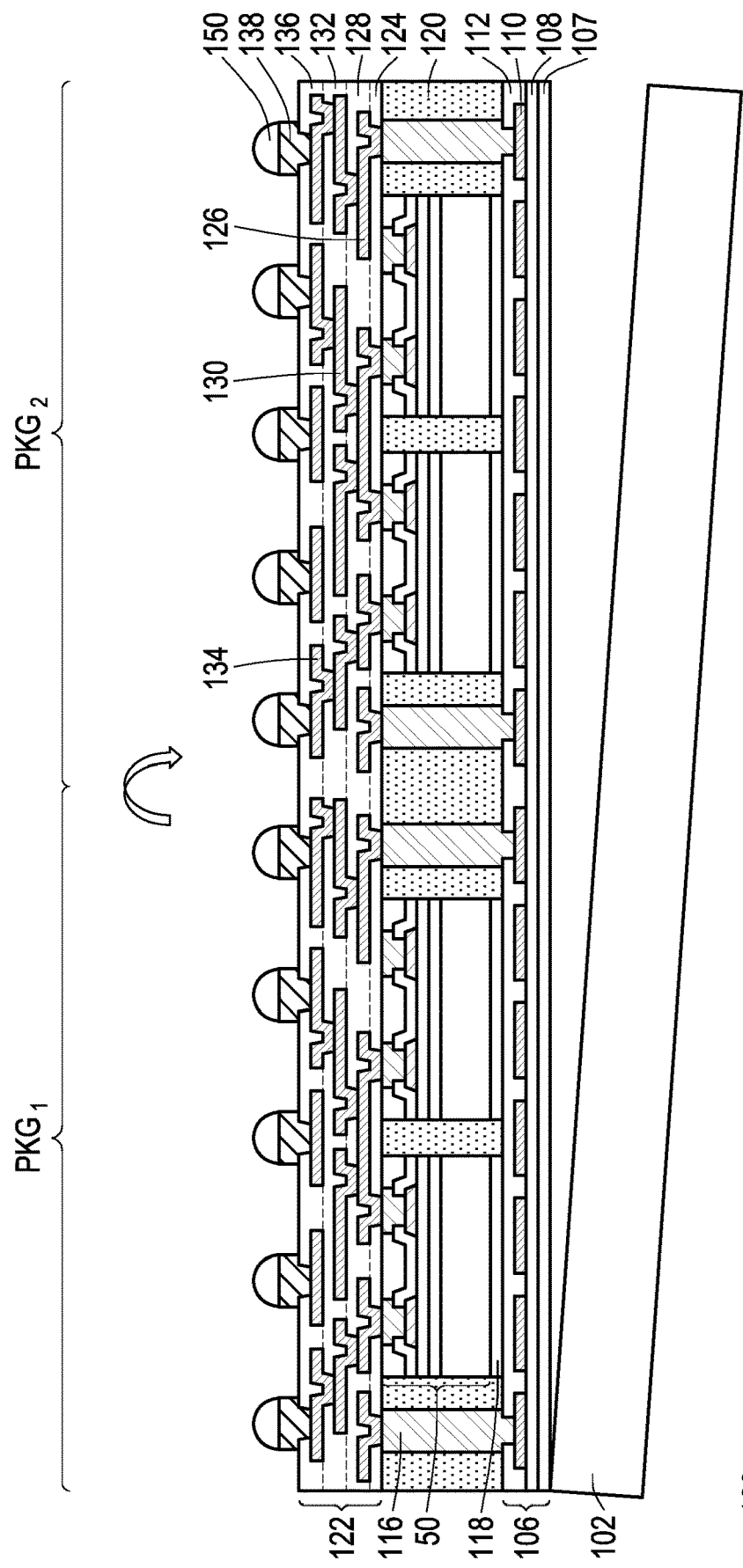

In FIG. 14, a carrier substrate de-bonding is performed to detach (or "de-bond") the carrier substrate 102 from the back-side redistribution structure 106, e.g., the insulating layer 107. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 15A:
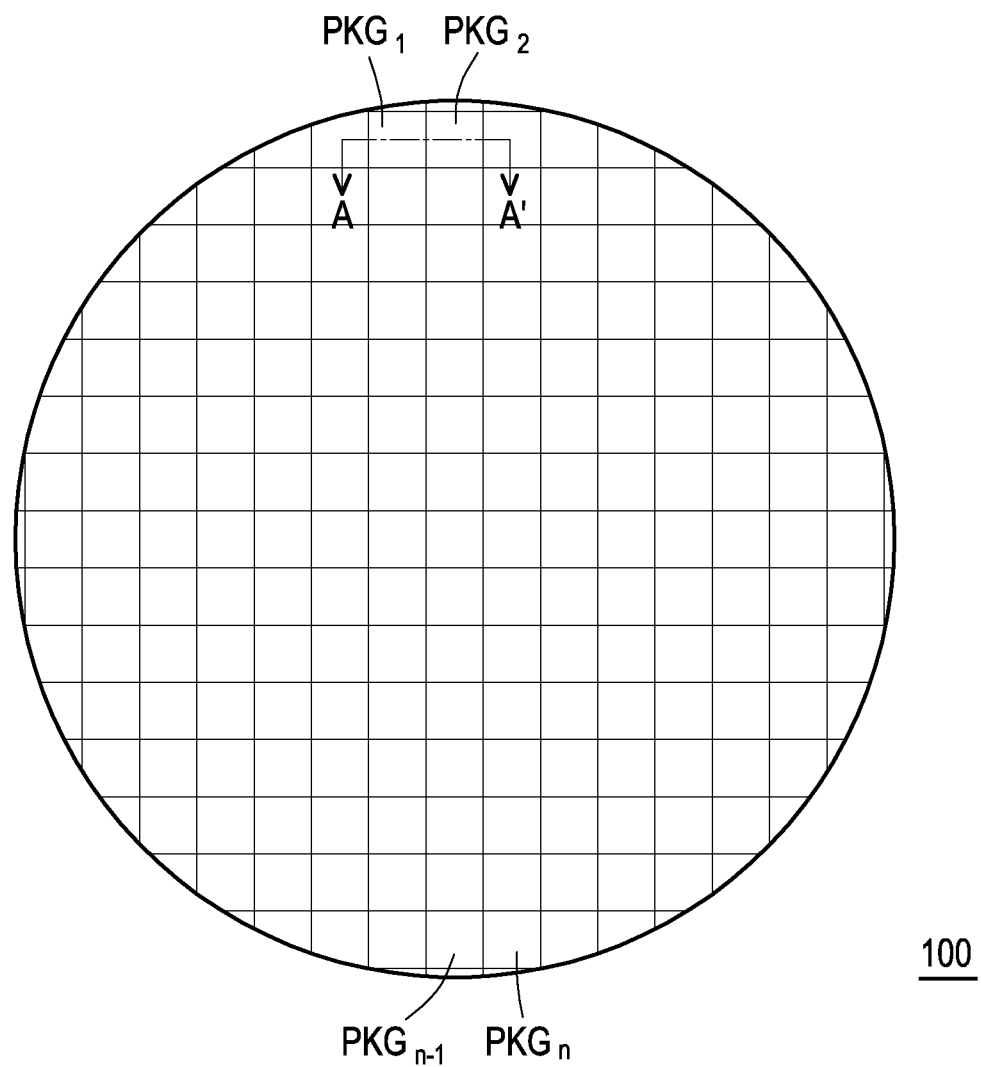
Figure 15B:
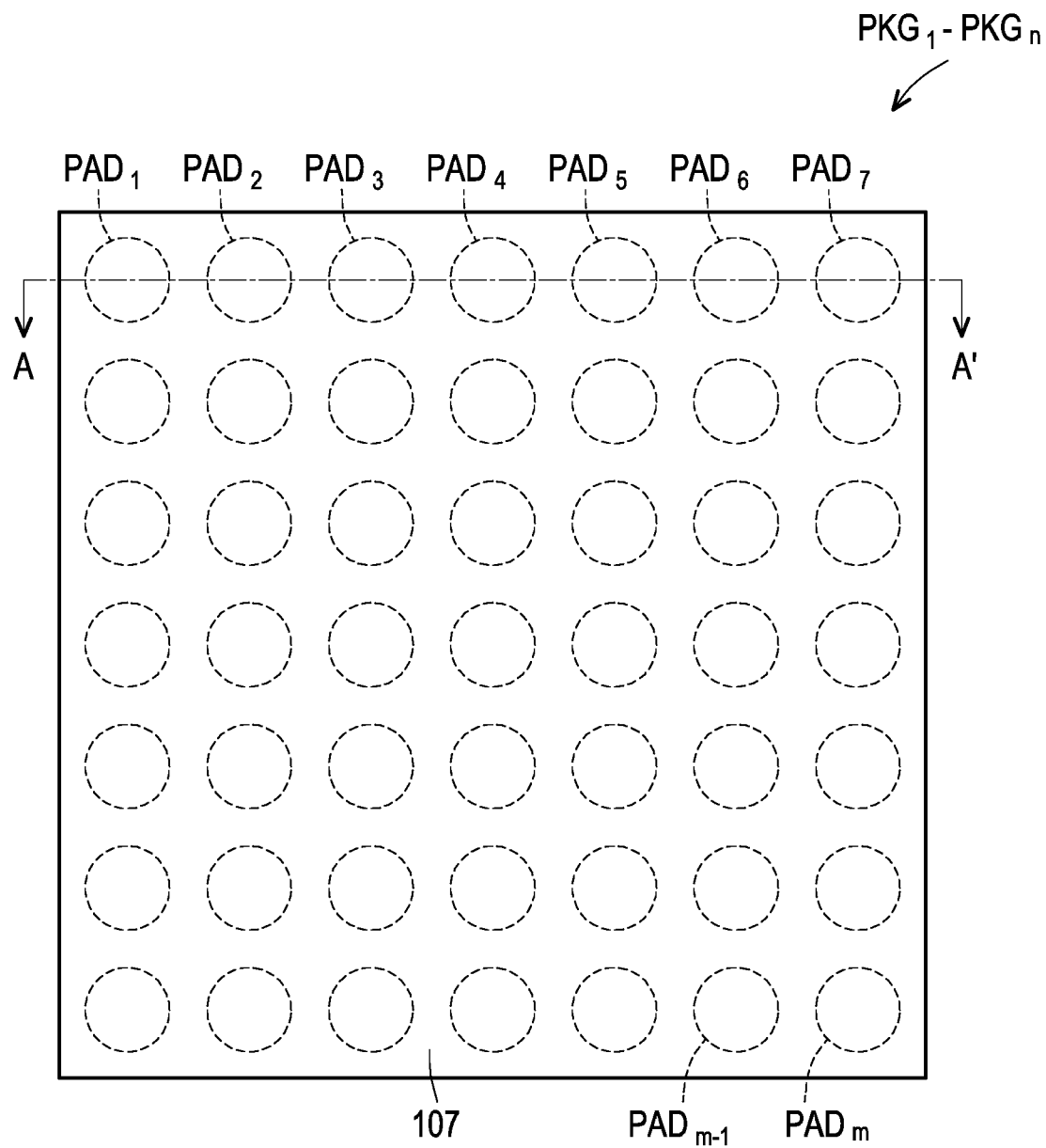
Figure 15C:
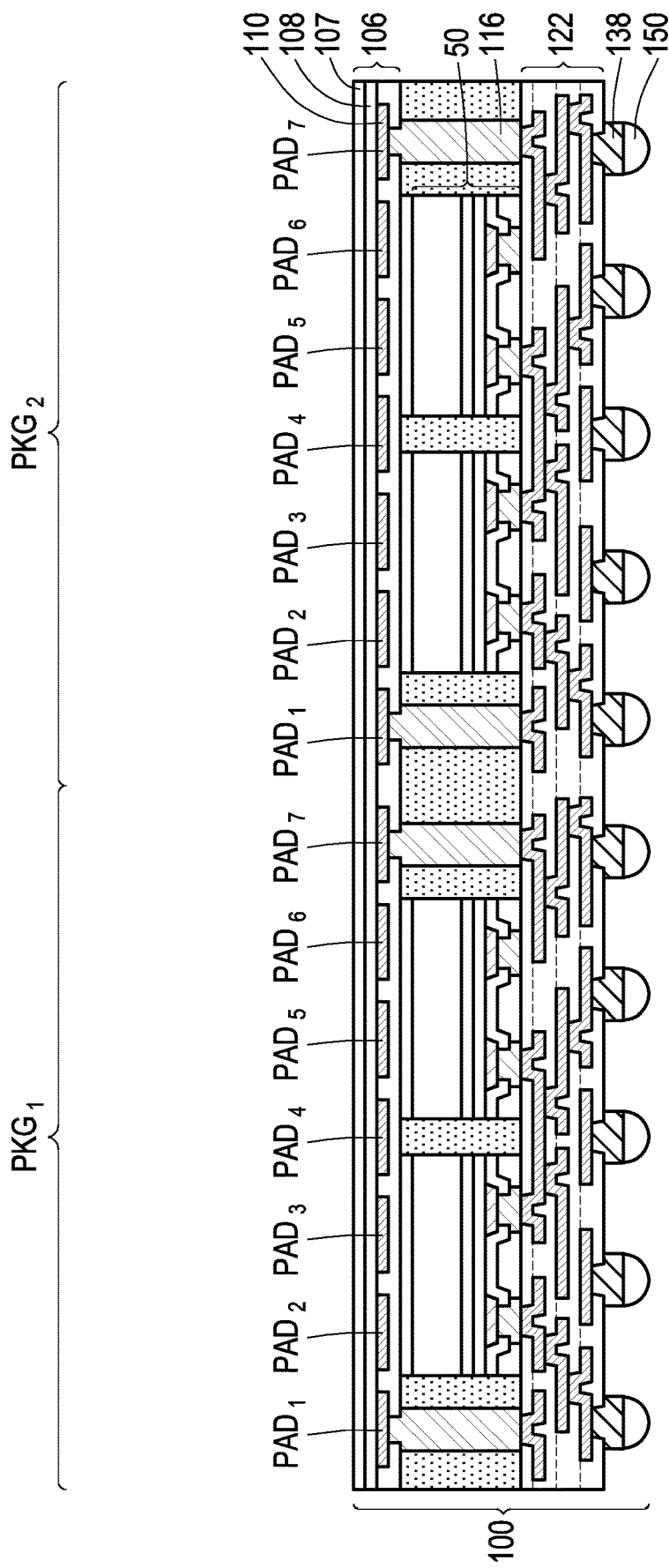

FIGS. 15A-15C illustrate the first package component 100 after flipping over and placing on the tape (not shown) in accordance with some embodiments. FIG. 15A illustrates a top view of the first package component 100 comprising package regions PKG1 to PKGn. FIG. 15B illustrates a top view of the package regions PKG1 to PKGn of the first package component 100. FIG. 15C illustrates a cross-section view of the first package component 100 along a line AA' in FIGS. 15A and 15B.

Referring to FIGS. 15A-15C, in some embodiments, the first package component 100 is a wafer-level structure and comprises a plurality of package regions PKG1 to PKGn, where n is between 150 and 600. In some embodiments, the metallization pattern 110 of each of the package regions PKG1 and PKG2 comprises pads PAD1 to PADm, where m is between 200 and 600.

In the illustrated embodiment, the insulating layer 107 is formed while forming the back-side redistribution structure 106 as described above with reference to FIG. 3. In alternative embodiments, the insulating layer 107 is not formed while forming the back-side redistribution structure 106. In such embodiments, the insulating layer 107 may be formed on the back-side redistribution structure 106 after de-bonding the carrier substrate 102 from the back-side redistribution structure 106 as described above with reference to FIG. 14.

Figure 16A:
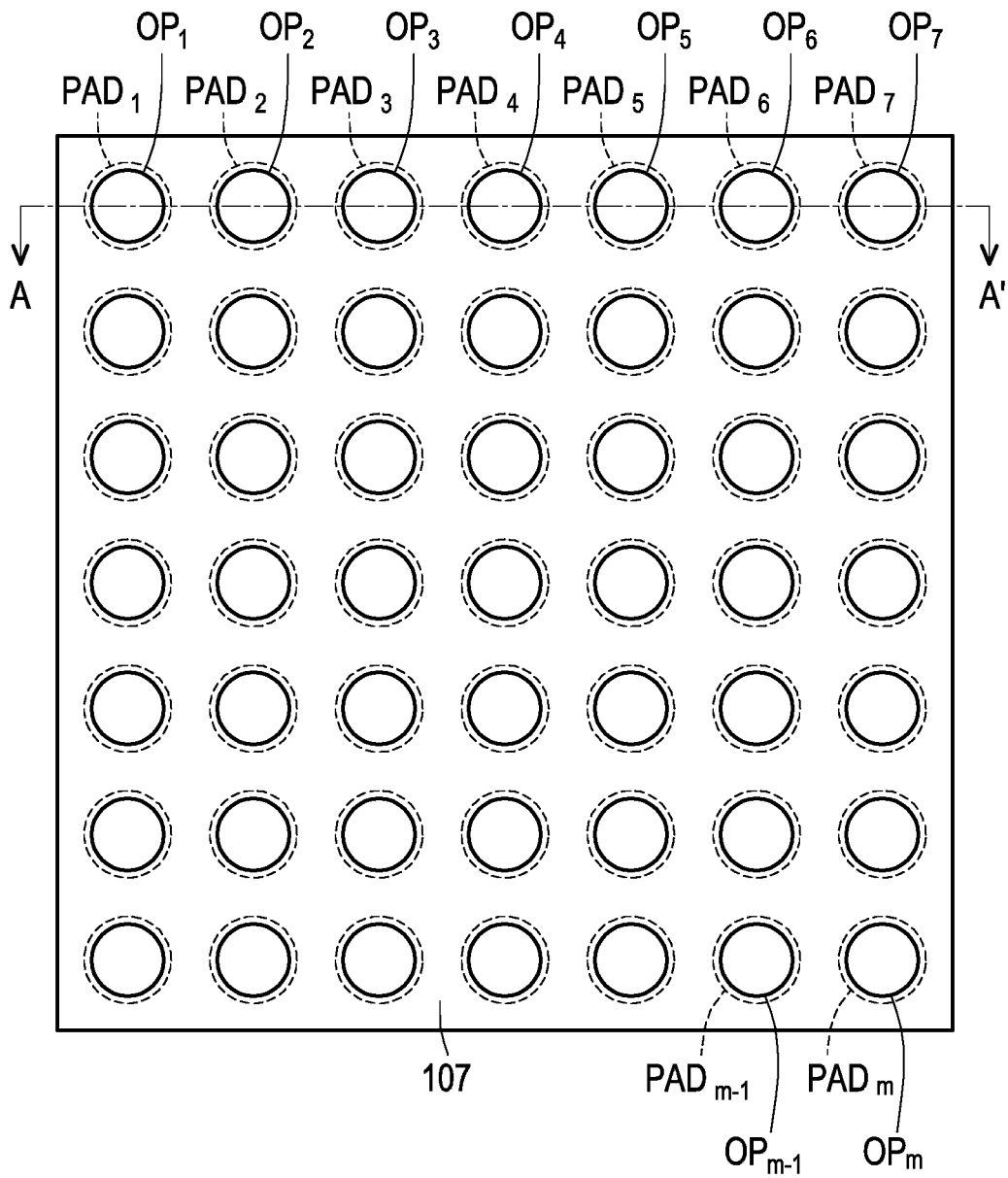
Figure 16B:
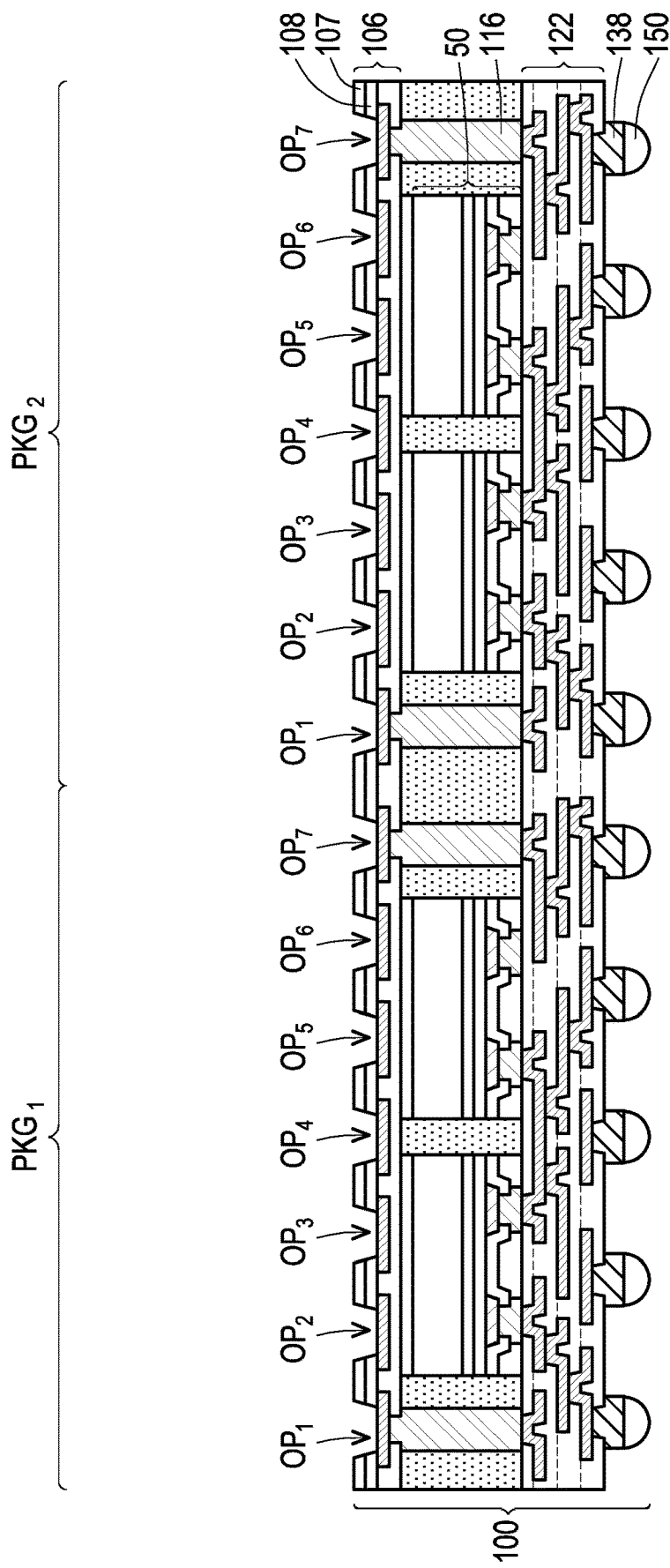

FIGS. 16A and 16B illustrate top and cross-sectional views of the first package component 100 after pattering the insulating layers 107 and 108 to form openings $OP_1$ to $OP_m$ exposing the pads $PAD_1$ to $PAD_m$, respectively. FIG. 16A illustrates a top view of the package regions $PKG_1$ to PKGn of the first package component 100. FIG. 16B illustrates a cross-section view of the first package component 100 along a line AA' in FIG. 16A. In some embodiments, the openings $OP_1$ to $OP_m$ may be formed using a laser drilling process as described below with reference to FIGS. 17-23 and a detailed description is provided at that time. In other embodiments, the openings $OP_1$ to $OP_m$ may be formed using a laser drilling process as described below with reference to FIGS. 24-28 and a detailed description is provided at that time. In yet other embodiments, the openings $OP_1$ to $OP_m$ may be formed using a laser drilling process as described below with reference to FIG. 29 and a detailed description is provided at that time.

Figure 17:
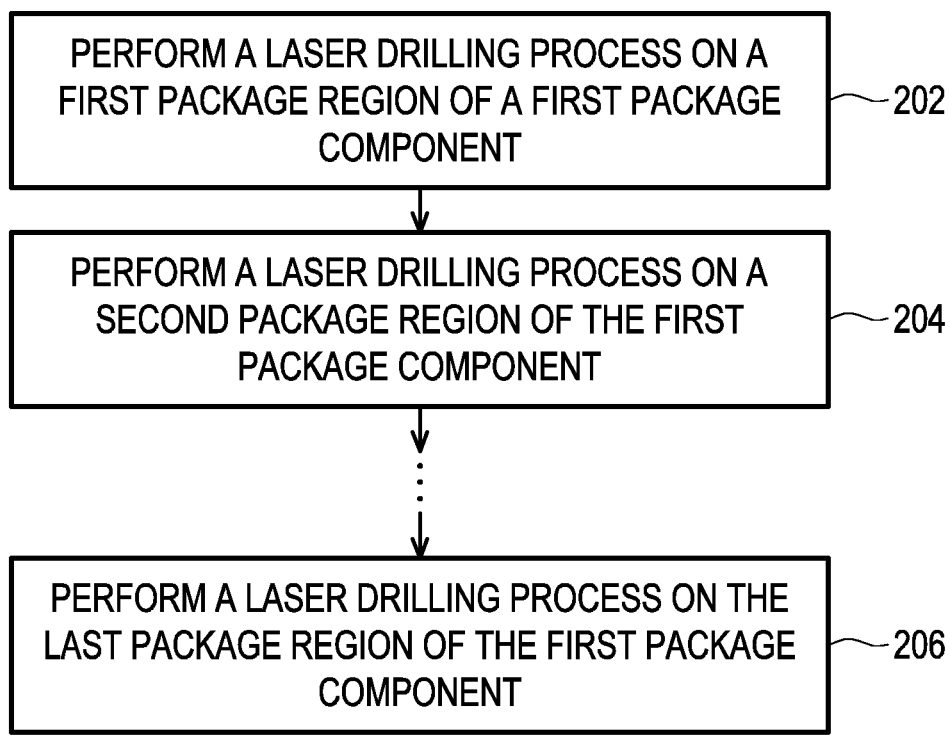
FIG. 17 is a flow diagram illustrating a laser drilling process performed on a package component in accordance with some embodiments.
Figure 18:
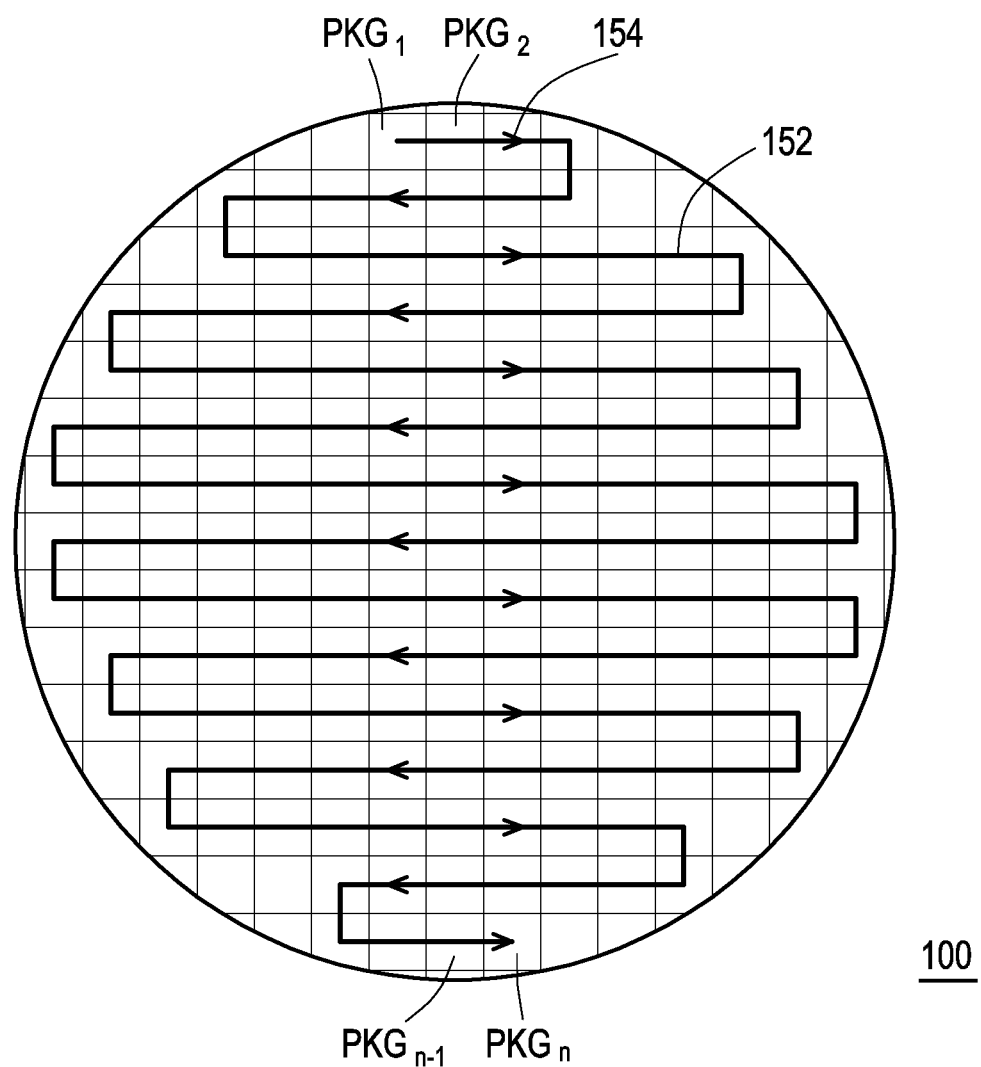

FIG. 17 is a flow diagram illustrating a laser drilling process 200 performed on a first package component 100 in accordance with some embodiments. FIG. 18 illustrates a top view of intermediate steps during performing the laser drilling process 200 in accordance with some embodiments. Referring to FIGS. 17 and 18, the laser drilling process 200 starts with step 202, when a laser drilling process is performed on a first package region PKG1 of the first package component 100 and forms openings OP1 to OPm (see FIG. 16A) in the first package region PKG1. In step 204, a laser drilling process is performed on a second package region PKG2 of the first package component 100 and forms openings OP1 to OPm (see FIG. 16A) in the second package region PKG2. Subsequently, a laser drilling process is performed on the package regions PKG2 to PKGn−1 of the first package component 100 and forms openings OP1 to OPm (see FIG. 16A) in the package regions PKG2 to PKGn−1. In step 206, a laser drilling process is performed on the last package region PKGn of the first package component 100 and forms openings OP1 to OPm (see FIG. 16A) in the last package region PKGn.

In some embodiments, the laser drilling process 200 is performed on the first package component 100 along a path 152 in a direction defined by arrows 154. In the illustrated embodiment, the path 152 follows each row of the package regions in the first package component 100. In other embodiments, the path 152 may follow any sequence starting with the first package region $PGK_1$, ending with the last package region $PGK_n$, and passing through all intermediate package regions in any order.

Figure 19:
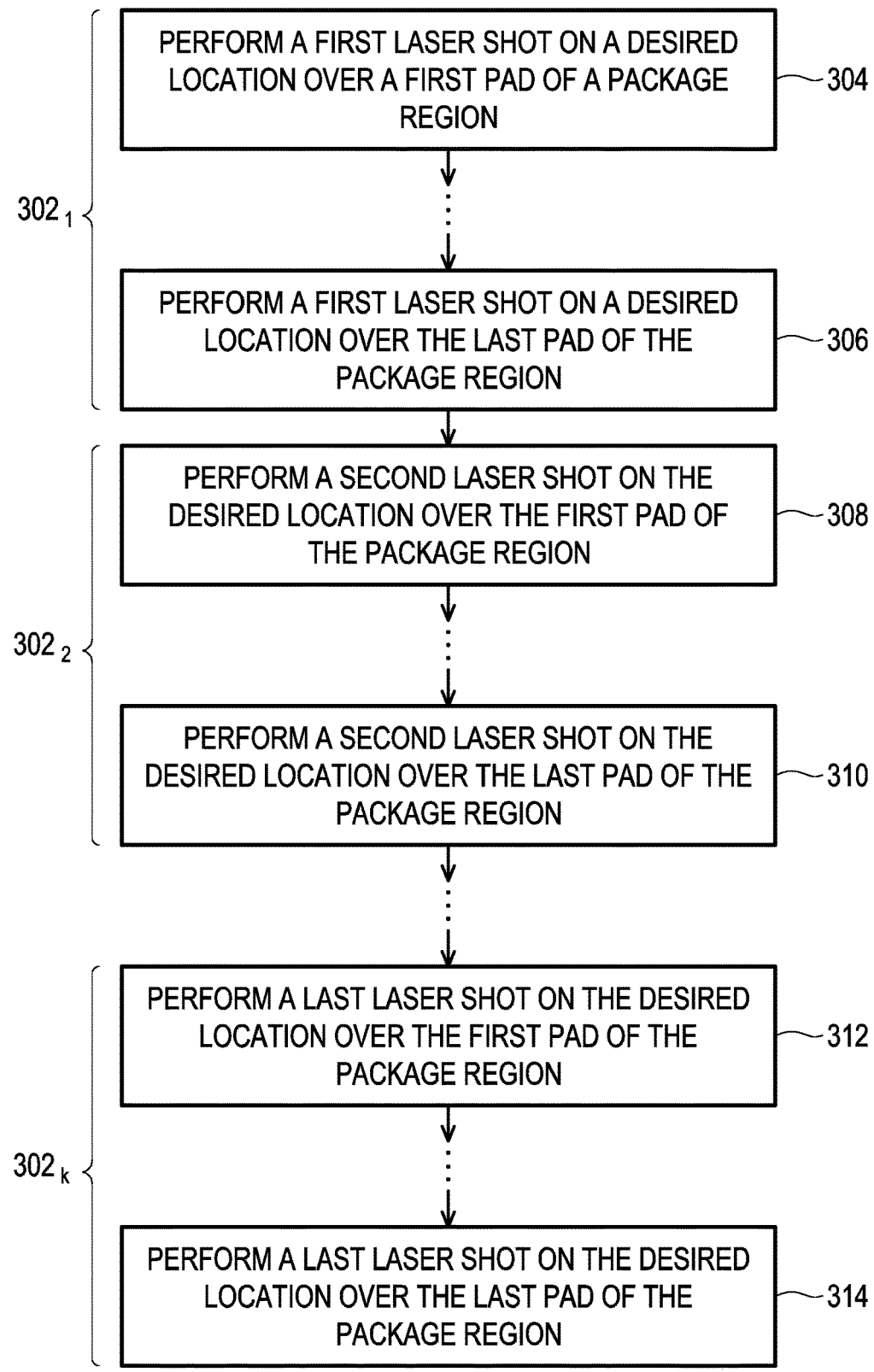
FIG. 19 is a flow diagram illustrating a laser drilling process performed on a package region of a package component in accordance with some embodiments.
Figure 20:
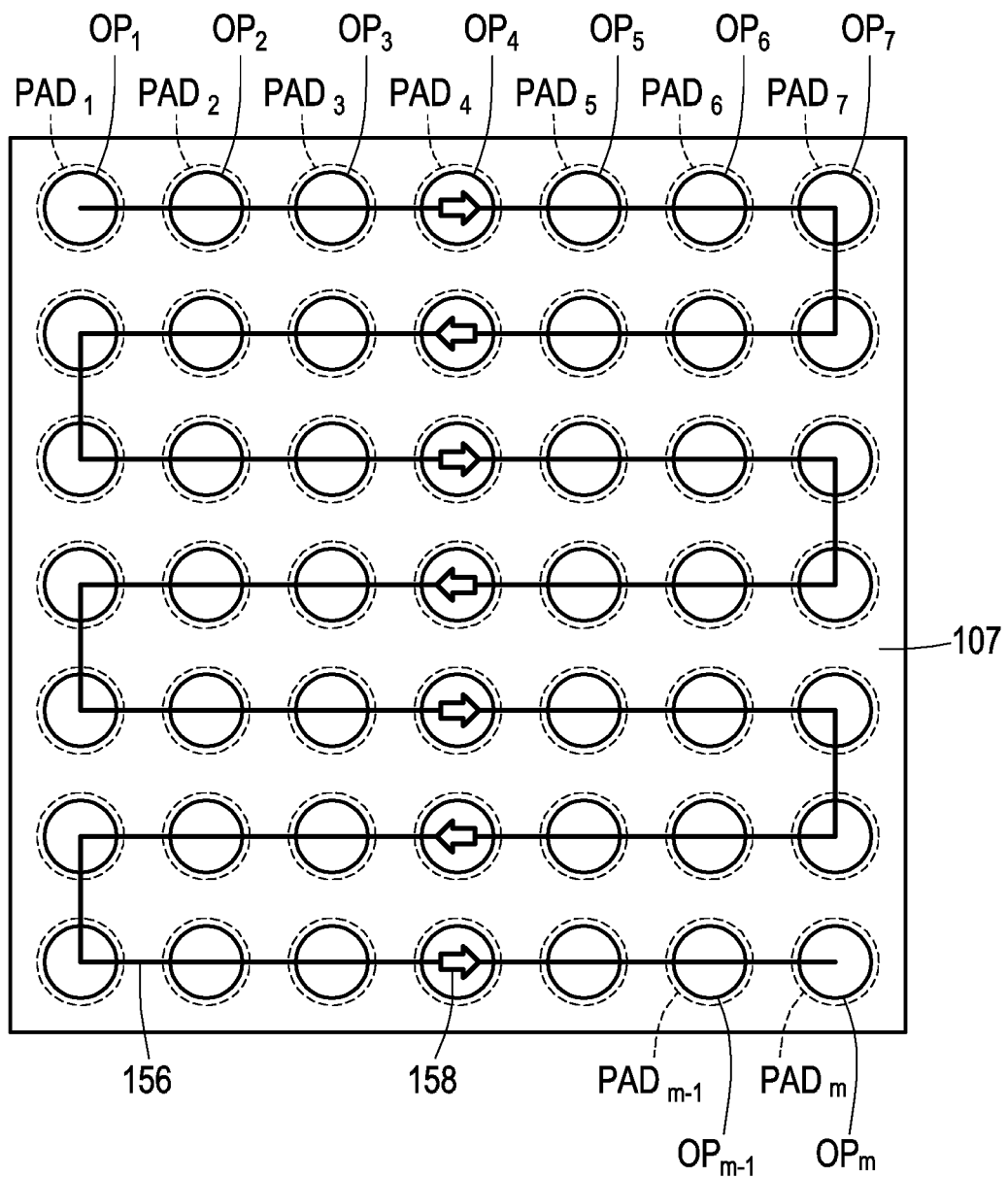
Figure 21:
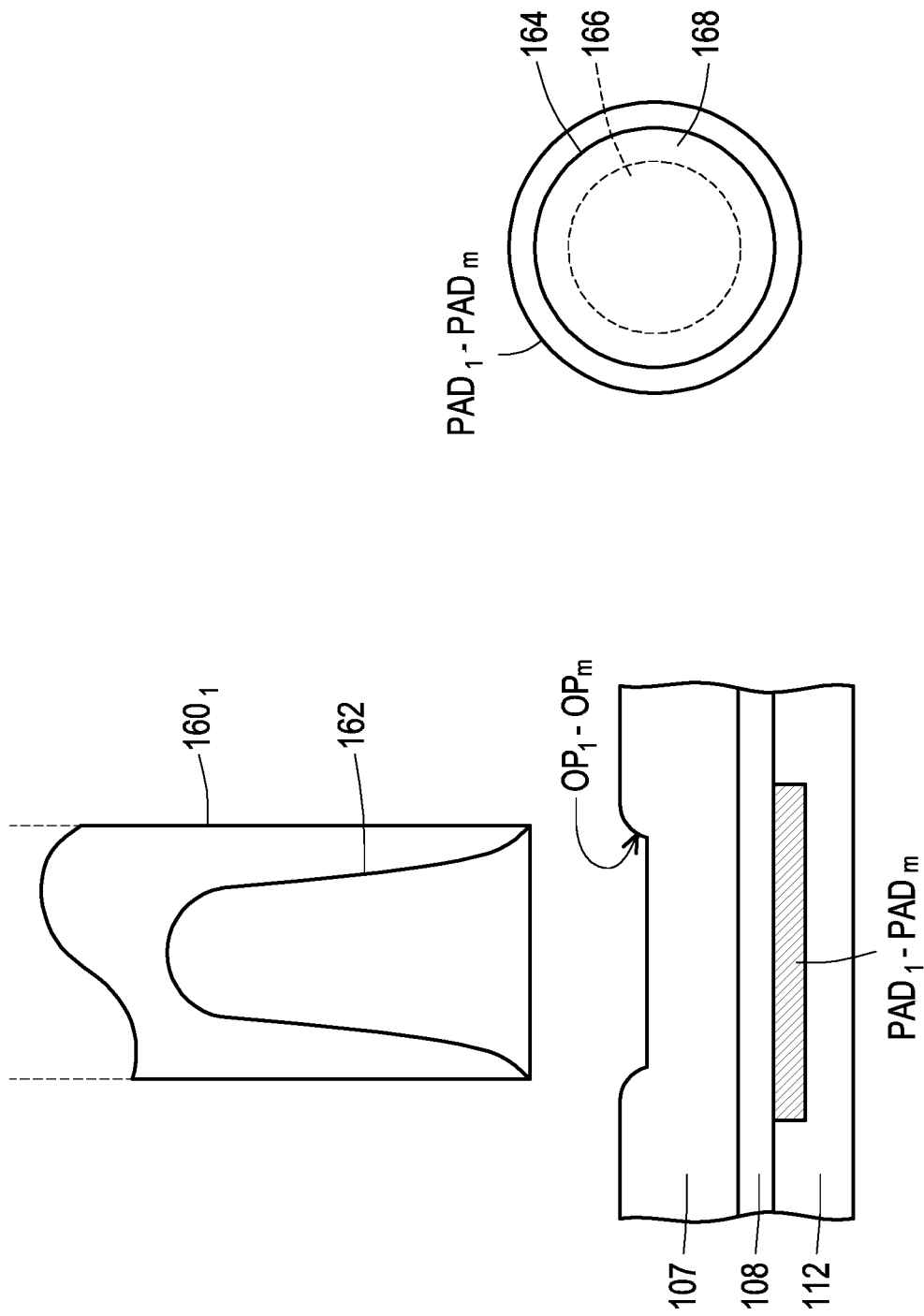
Figure 22:
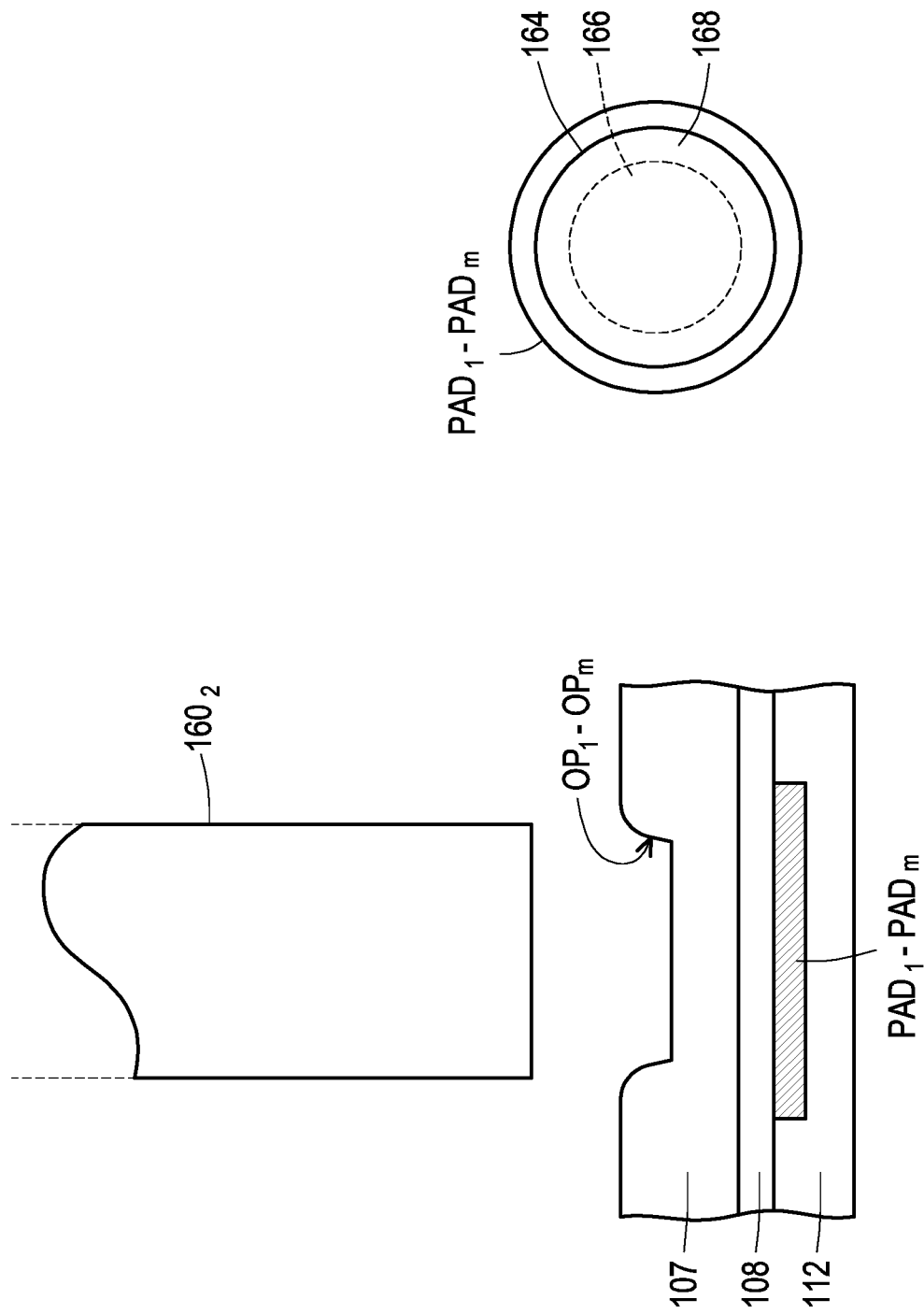
Figure 23:
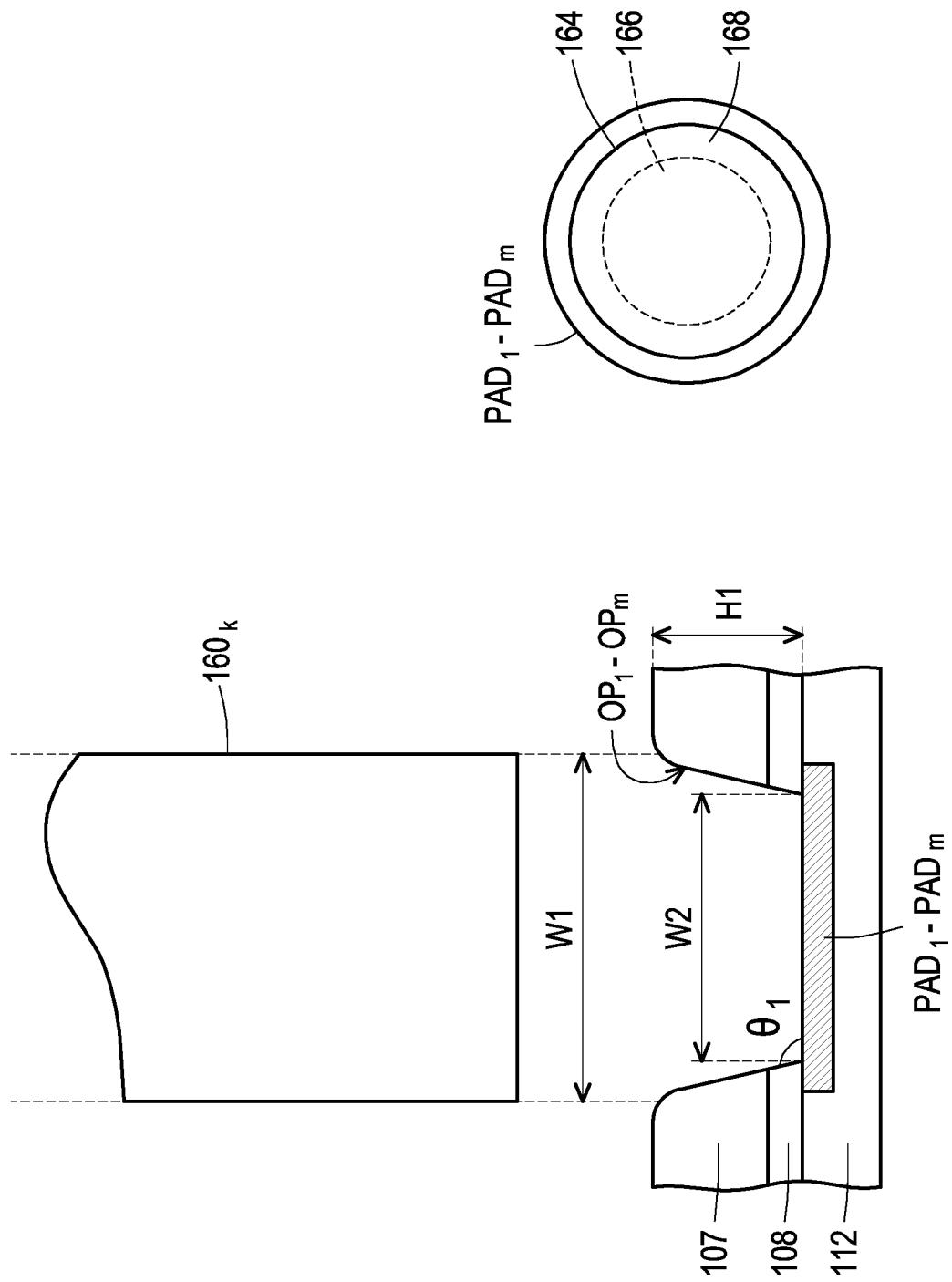

FIG. 19 is a flow diagram illustrating a laser drilling process 300 performed on a package region (such as any of the package regions $PKG_1$ to $PKG_n$) of the first package component 100 in accordance with some embodiments. FIG. 20 illustrates a top view of intermediate steps during performing the laser drilling process 300 in accordance with some embodiments. FIGS. 21-23 illustrate cross-sectional views of intermediate steps during a process for forming the openings $OP_1$ to $OP_m$ over the pads $PAD_1$ to $PAD_m$, respectively, according to the laser drilling process 300. In some embodiments, the laser drilling process 300 may be used to implement steps 202-206 of the laser drilling process 200 (see FIG. 17).

Referring to FIGS. 19 and 20, in some embodiments, the laser drilling process 300 is performed on a package region (such as any of the package regions $PKG_1$ to $PKG_n$) by performing a plurality of laser sequences $302_1$ to $302_k$, with the number of sequences k being between 2 and 50. In some embodiments, each of the laser sequences $302_1$ to $302_k$ is performed over the package region along a path 156 in a direction defined by arrows 158. In the illustrated embodiment, the path 156 follows each row of the pads (such as pads $PAD_1$ to $PAD_m$) in the package region. In other embodiments, the path 156 may follow any sequence starting with the first pad $PAD_1$, ending with the last pad $PAD_m$, and passing through all intermediate pads in any order.

Referring to FIGS. 19, 20, and 21, in some embodiments, a first laser sequence $302_1$ starts with step 304, when a first laser shot is performed on a first desired location over the pad $PAD_1$ of the package region. In some embodiments, the first laser shot is performed by a laser beam $160_1$. In some embodiments, a center of a laser spot 164 created by the laser beam $160_1$ is aligned with a center of the pad $PAD_1$ in a plan view and illuminates the first desired location. The first laser shot removes a portion of the insulating layers 107 and 108 in the first desired location and forms an opening $OP_1$ without exposing the pad $PAD_1$. In some embodiments, the laser beam $160_1$ has a Gaussian intensity profile illustrated by a curve 162, such that the laser spot 164 comprises a high intensity region 166 surrounded by a low intensity region 168. Due the non-uniform intensity of the laser beam $160_1$, the opening $OP_1$ has sloped sidewalls.

In some embodiments, first laser shots are performed on pads $PAD_2$ to $PAD_{m-1}$ in a similar manner as the first laser shot performed on the first pad $PAD_1$ described above with reference to step 304 and the description is not repeated herein. Subsequently, in step 306, a first laser shot is performed on a first desired location over the last pad $PAD_m$ of the package region. In some embodiments, the first laser shot is performed by the laser beam $160_1$. In some embodiments, a center of the laser spot 164 created by the laser beam $160_1$ is aligned with a center of the last pad $PAD_m$ in the plan view and illuminates the first desired location. The first laser shot removes a portion of the insulating layer 107 and 108 in the first desired location and forms an opening $OP_m$ without exposing the last pad $PAD_m$. Due the non-uniform intensity of the laser beam $160_1$, the opening $OP_m$ has sloped sidewalls.

Referring to FIGS. 19, 20, and 22, after performing the first laser sequences $302_1$, a second laser sequence $302_2$ is performed on the package region of the first package component 100. In some embodiments, a second laser sequence $302_2$ starts with step 308, when a second laser shot is performed on a second desired location over the pad $PAD_1$ of the package region, with the second desired location being same as the first desired location of step 304 of the first laser sequence $302_1$. In some embodiments, the second laser shot is performed by a laser beam $160_2$. The laser beam $160_2$ may be similar to the laser beam $160_1$ and the description is not repeated herein. In some embodiments, a center of a laser spot 164 created by the laser beam $160_2$ is aligned with the center of the pad $PAD_1$ in the plan view and illuminates the second desired location. The second laser shot removes a portion of the insulating layers 107 and 108 in the second desired location and extends the opening $OP_1$ toward the pad $PAD_1$ without exposing the pad $PAD_1$. Due the non-uniform intensity of the laser beam $160_2$, the extended opening $OP_1$ has sloped sidewalls.

In some embodiments, second laser shots are performed on pads $PAD_2$ to $PAD_{m-1}$ in a similar manner as the second laser shot performed on the first pad $PAD_1$ described above with reference to step 308 and the description is not repeated herein. Subsequently, in step 310, a second laser shot is performed on a second desired location over the last pad $PAD_m$ of the package region, with the second desired location being same as the first desired location of step 306 of the first laser sequence $302_1$. In some embodiments, the second laser shot is performed by a laser beam $160_2$. In some embodiments, a center of a laser spot 164 created by the laser beam $160_2$ is aligned with the center of the last pad $PAD_m$ in the plan view and illuminates the second desired location. The second laser shot removes a portion of the insulating layers 107 and 108 in the second desired location and extends the opening $OP_m$ toward the last pad $PAD_m$ without exposing the last pad $PAD_m$. Due the non-uniform intensity of the laser beam $160_2$, the extended opening $OP_m$ has sloped sidewalls.

In some embodiments, after performing the second laser sequence $302_2$, additional laser sequences are performed on the package region of the first package component 100 until the last laser sequence $302_k$ is performed on the package region. The additional laser sequences are similar to the first laser sequence $302_1$ and the description is not repeated herein. The addition laser sequences remove portions of the insulating layers 107 and 108 and extend the openings $OP_1$ to $OP_m$ toward the pads $PAD_1$ to $PAD_m$, respectively, without exposing the pads $PAD_1$ to $PAD_m$.

Referring to FIGS. 19, 20, and 23, in some embodiments, the last laser sequence $302_k$ starts with step 312, when last laser shot is performed on the last desired location over the first pad $PAD_1$ of the package region, with the last desired location being same as the first desired location of step 304 of the first laser sequence $302_1$. In some embodiments, the last laser shot is performed by a laser beam $160_k$. The laser beam $160_k$ may be similar to the laser beam $160_1$ and the description is not repeated herein. In some embodiments, a center of a laser spot 164 created by the laser beam $160_k$ is aligned with the center of the first pad $PAD_1$ in the plan view and illuminates the last desired location. The last laser shot removes a portion of the insulating layers 107 and 108 in the last desired location, extends the opening $OP_1$ toward the first pad $PAD_1$ and exposes the first pad $PAD_1$. Due the non-uniform intensity of the laser beam $160_k$, the extended opening $OP_1$ has sloped sidewalls.

In some embodiments, last laser shots are performed on pads $PAD_2$ to $PAD_{m-1}$ in a similar manner as the last laser shot performed on the first pad $PAD_1$ described above with reference to step 312 and the description is not repeated herein. Subsequently, in step 314, the last laser shot is performed on the last desired location over the last pad $PAD_m$ of the package region, with the last desired location being same as the first desired location of step 306 of the first laser sequence $302_1$. In some embodiments, the last laser shot is performed by the laser beam $160_k$. In some embodiments, a center of a laser spot 164 created by the laser beam $160_k$ is aligned with the center of the last pad $PAD_m$ in the plan view and illuminates the last desired location. The last laser shot removes a portion of the insulating layers 107 and 108 in the last desired location, extends the opening $OP_m$ toward the last pad $PAD_m$ and exposes the last pad $PAD_m$. Due the non-uniform intensity of the laser beam $160_k$, the extended opening $OP_m$ has sloped sidewalls.

As described in greater detail above, during the laser drilling process 300, each laser shot that is performed over a same pad of a package region is performed on a same location. Such a laser shot mode may be also referred to as a dot mode. Furthermore, during the laser drilling process 300, time between consecutive laser shots that are performed over a pad of a package region is increased, which allows for heat to dissipate between consecutive laser shots. Accordingly, heat accumulation on the pads $PAD_1$ to $PAD_m$ is reduced, which reduces dendrite formation on the pads $PAD_1$ to $PAD_m$ and reduces or avoids delamination between pads $PAD_1$ to $PAD_m$ and adjacent insulating layers 108 and 112. In some embodiments, the time between consecutive laser shots is between about 0.1 sec and about 1 sec. In some embodiments, laser shots of the laser drilling process 300 (see FIG. 19) may also referred as laser pulses. In some embodiments, each laser shot has a power between about 3 W and about 10 W.

Referring further to FIG. 23, each of the openings $OP_1$ to $OP_m$ has a height H1, a width W1 at a top of each of the openings $OP_1$ to $OP_m$, and a width W2 at a bottom of each of the openings $OP_1$ to $OP_m$. A sidewall and a bottom of each of the openings $OP_1$ to $OP_m$ form an angle θ1. In some embodiments, the height H1 is between about 10 μm and about 80 μm. In some embodiments, the width W1 is between about 200 μm and about 330 μm. In some embodiments, the width W2 is between about 200 μm and about 270 μm. In some embodiments, a ratio of the width W1 to the width W2 (W1/W2) is between about 1 and about 1.5. In some embodiments, a ratio of the width W1 to the height H1 (W1/H1) is between about 3 and about 8. In some embodiments, a ratio of the width W2 to the height H1 (W2/H1) is between about 2.5 and about 27. In some embodiments, the angle $θ_1$ is between about 90 degrees and about 150 degrees.

Figure 24:
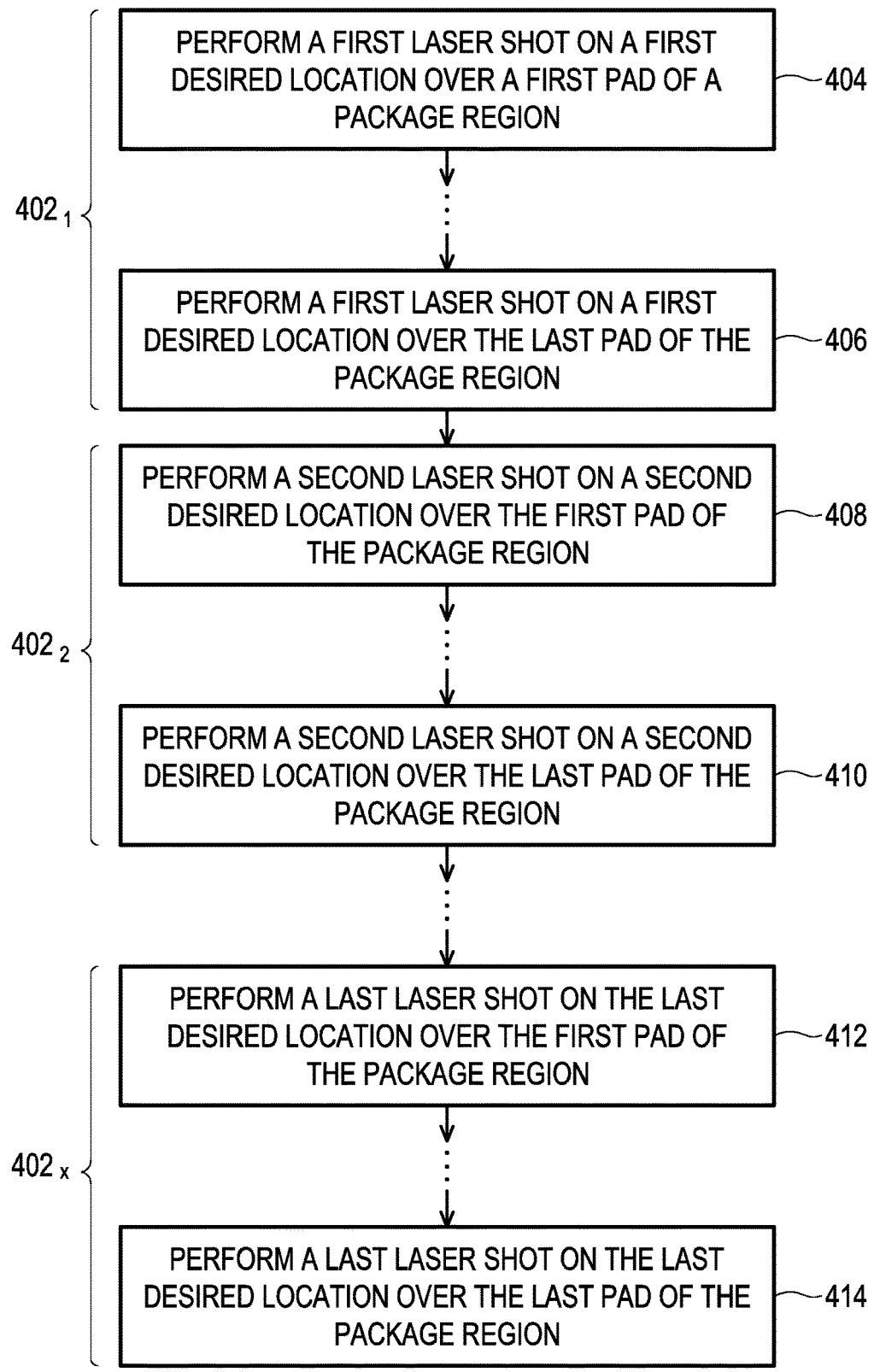
FIG. 24 is a flow diagram illustrating a laser drilling process performed on a package region of a package component in accordance with some embodiments.
Figure 25:
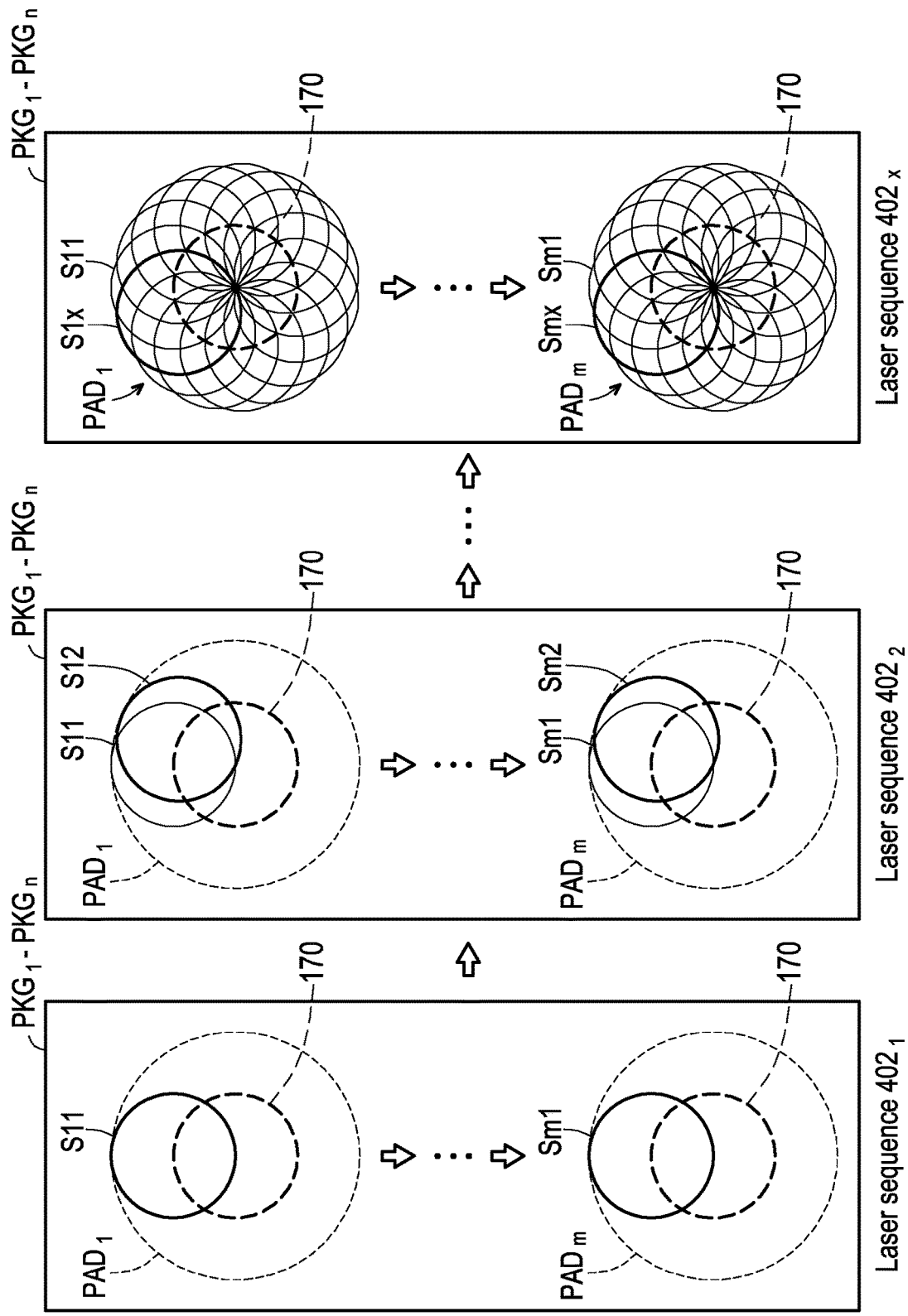
Figure 26:
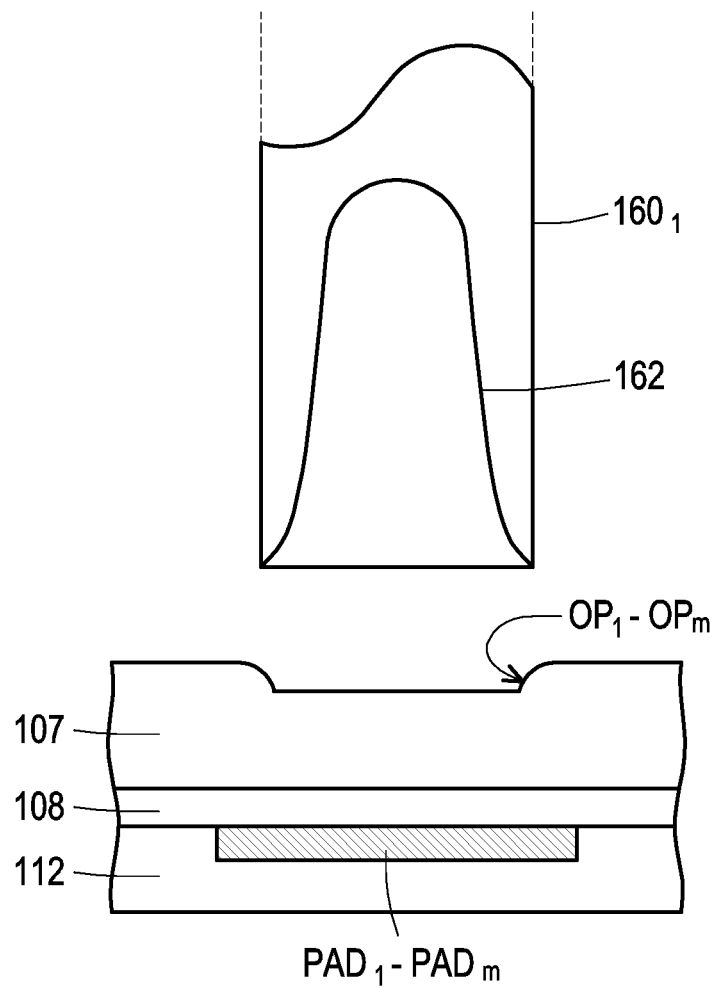
Figure 27:
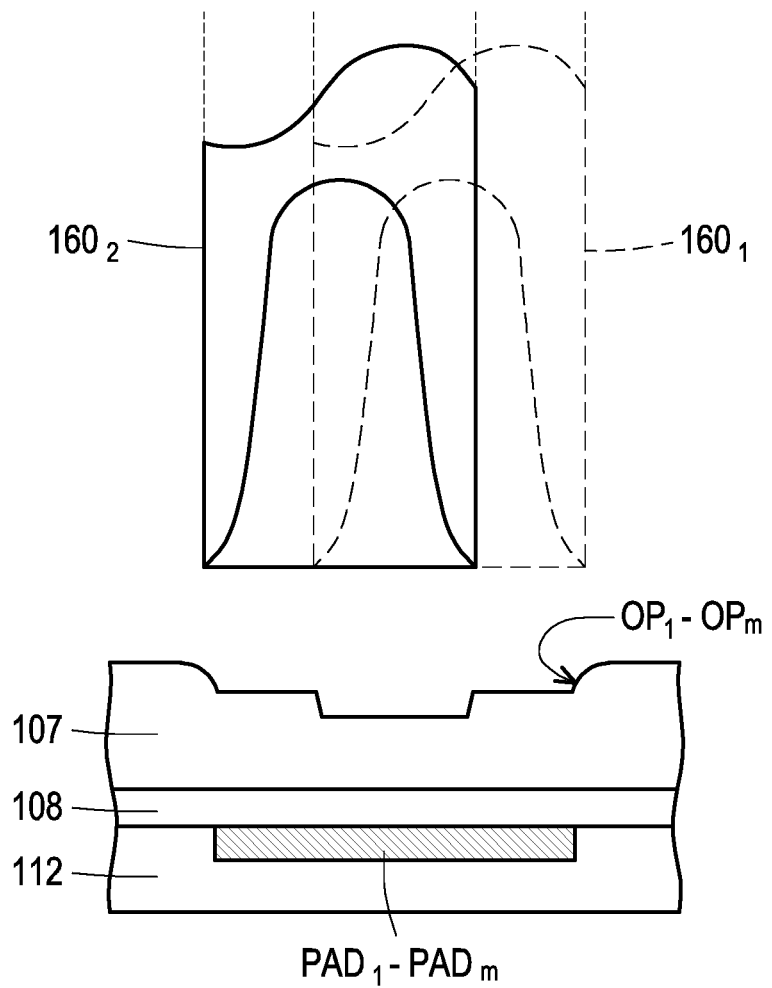
Figure 28:
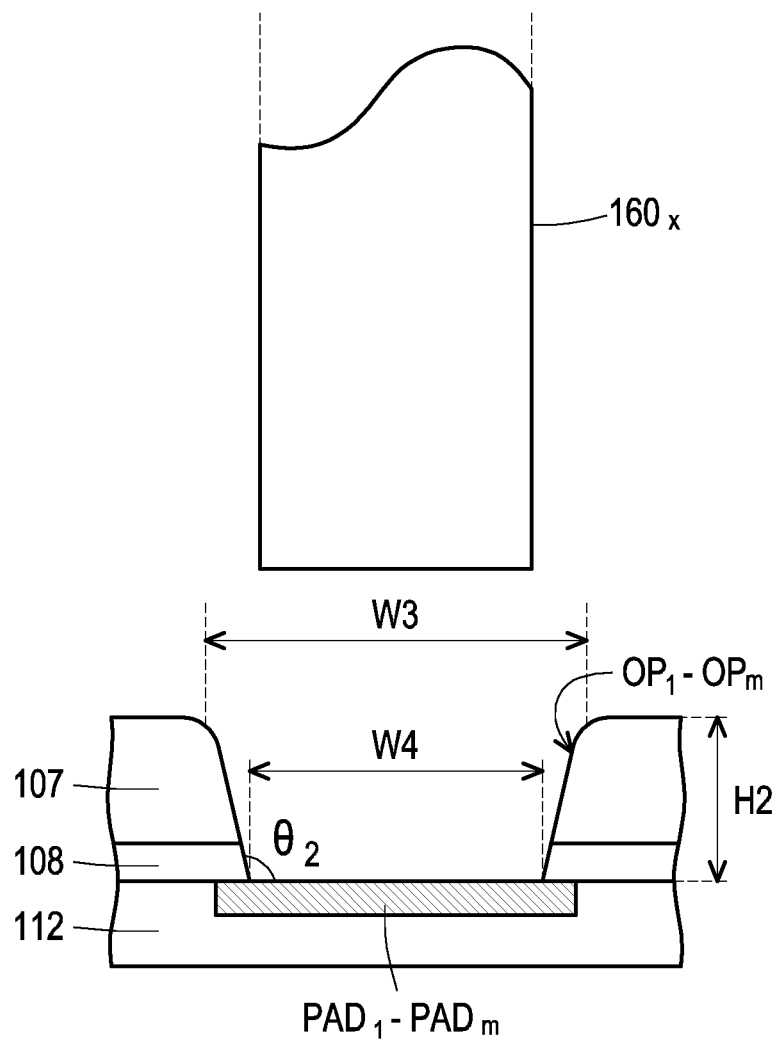

FIG. 24 is a flow diagram illustrating a laser drilling process 400 performed on a package region (such as any of the package regions PKG1 to PKGn) of the first package component 100 in accordance with some embodiments. FIG. 25 illustrates a top view of intermediate steps during performing the laser drilling process 400 in accordance with some embodiments. FIGS. 26-28 illustrate cross-sectional views of intermediate steps during a process for forming the openings OP1 to OPm over the pads PAD1 to PADm according to the laser drilling process 400. In some embodiments, the laser drilling process 400 may be used to implement steps 202-206 of the laser drilling process 200 (see FIG. 17).

Referring to FIGS. 24 and 25, in some embodiments, the laser drilling process 400 is performed on a package region (such as any of the package regions $PKG_1$ to $PKG_n$) by performing a plurality of laser sequences $402_1$ to $402_x$, with the number of laser sequences x being between 3 and 50. In some embodiments, each of the laser sequences $402_1$ to $402_x$ is performed over the package region along a path similar to the path 156 described above with reference to FIG. 20, and the description is not repeated herein. In other embodiments, the path may follow any sequence starting with the first pad $PAD_1$, ending with the last pad $PAD_m$, and passing through all intermediate pads in any order.

Referring to FIGS. 24, 25, and 26, in some embodiments, a first laser sequence $402_1$ starts with step 404, when a first laser shot is performed on a first desired location over the first pad $PAD_1$ of the package region. In some embodiments, the first laser shot is performed by a laser beam $160_1$. In some embodiments, the laser beam $160_1$ is positioned such that an entirety of a laser spot S11 created by the laser beam $160_1$ is within a perimeter of the first pad $PAD_1$ and fully overlaps with the first pad $PAD_1$ in a plan view. In some embodiments, an edge of the laser spot S11 of the laser beam $160_1$ coincides an edge of the first pad $PAD_1$ in the plan view. The laser spot S11 illuminates the first desired location. The first laser shot removes a portion of the insulating layers 107 and 108 in the first desired location and forms an opening $OP_1$ without exposing the first pad $PAD_1$. Due the non-uniform intensity of the laser beam $160_1$, the opening $OP_1$ has sloped sidewalls.

In some embodiments, first laser shots are performed on pads $PAD_2$ to $PAD_{m-1}$ in a similar manner as the first laser shot performed on the first pad $PAD_1$ described above with reference to step 404 and the description is not repeated herein. Subsequently, in step 406, a first laser shot is performed on a first desired location over the last pad $PAD_m$ of the package region. In some embodiments, the first laser shot is performed by a laser beam $160_1$. In some embodiments, the laser beam $160_1$ is positioned such that an entirety of a laser spot Sm1 created by the laser beam $160_1$ is within a perimeter of the last pad $PAD_m$ and fully overlaps with the last pad $PAD_m$ in the plan view. In some embodiments, an edge of the laser spot Sm1 of the laser beam $160_1$ coincides an edge of the last pad $PAD_m$ in the plan view. The laser spot Sm1 illuminates the first desired location. The first laser shot removes a portion of the insulating layers 107 and 108 in the first desired location and forms an opening $OP_m$ without exposing the last pad $PAD_m$. Due the non-uniform intensity of the laser beam $160_1$, the opening $OP_m$ has sloped sidewalls.

Referring to FIGS. 24, 25, and 27, after performing the first laser sequences $402_1$, a second laser sequences $402_2$ is performed on the package region of the first package component 100. In some embodiments, a second laser sequence $402_2$ starts with step 408, when a second laser shot is performed on a second desired location over the first pad PAD1 of the package region, with the second desired location being different from the first desired location of step 404 of the first laser sequence $402_1$. In some embodiments, the second laser shot is performed by a laser beam 1602. In some embodiments, the laser beam 1602 is positioned such that an entirety of a laser spot S12 created by the laser beam 1602 is within a perimeter of the first pad PAD1 and fully overlaps with the first pad PAD1 in the plan view. In some embodiments, an edge of the laser spot S12 of the laser beam 1602 coincides the edge of the first pad PAD1 in the plan view. The laser spot S12 illuminates the second desired location. In some embodiments, the laser spot S12 of the laser beam 1602 partially overlaps with the laser spot S11 of the laser beam 1601. In some embodiments, a center of the laser spot S12 is shifted with respect to a center of the laser spot S11 along a circle 170 in a clockwise direction. A center of the circle 170 coincides with a center of the first pad PAD1 in the plan view. The second laser shot removes a portion of the insulating layers 107 and 108 in the second desired location and extends the opening OP1 toward the first pad PAD1 without exposing the first pad PAD1. Due the non-uniform intensity of the laser beam 1602, the extended opening OP1 has sloped sidewalls.

In some embodiments, second laser shots are performed on pads $PAD_2$ to $PAD_{m-1}$ in a similar manner as the second laser shot performed on the first pad $PAD_1$ described above with reference to step 408 and the description is not repeated herein. Subsequently, in step 410, a second laser shot is performed on a second desired location over the last pad $PAD_m$ of the package region, with the second desired location being different from the first desired location of step 406 of the first laser sequence $402_1$. In some embodiments, the second laser shot is performed by a laser beam $160_2$. In some embodiments, the laser beam $160_2$ is positioned such that an entirety of a laser spot Sm2 created by the laser beam $160_2$ is within a perimeter of the last pad $PAD_m$ and fully overlaps with the last pad $PAD_m$ in the plan view. In some embodiments, an edge of the laser spot Sm2 of the laser beam $160_2$ coincides the edge of the last pad $PAD_m$ in the plan view. The laser spot Sm2 illuminates the second desired location. In some embodiments, the laser spot Sm2 of the laser beam $160_2$ partially overlaps with the laser spot Sm1 of the laser beam $160_1$. In some embodiments, a center of the laser spot Sm2 is shifted with respect to a center of the laser spot Sm1 along the circle 170 in the clockwise direction. The second laser shot removes a portion of the insulating layers 107 and 108 in the second desired location and extends the opening $OP_m$ toward the last pad $PAD_m$ without exposing the last pad $PAD_m$. Due the non-uniform intensity of the laser beam $160_2$, the extended opening $OP_m$ has sloped sidewalls.

In some embodiments, after performing the second laser sequence $402_2$, additional laser sequences are performed on the package region of the first package component 100 until the last laser sequence $402_x$ is performed on the package region. The additional laser sequences are similar to the first laser sequence $402_1$ with a distinction that each laser sequence removes a portion of the insulation layers 107 and 108 from a new location that is different from the previous location of the previous laser sequence. In some embodiments, a center of the new location is shifted with respect to a center of the previous location along the circle 170 in the clockwise direction. The addition laser sequences remove portions of the insulating layers 107 and 108 and extend the openings $OP_1$ to $OP_m$ toward the pads $PAD_1$ to $PAD_m$, respectively, without exposing the pads $PAD_1$ to $PAD_m$.

Referring to FIGS. 24, 25, and 28, in some embodiments, the last laser sequence $402_x$ starts with step 412, when last laser shot is performed on the last desired location over the first pad $PAD_1$ of the package region, with the last desired location being different from desired locations of the previous laser sequences. In some embodiments, the last laser shot is performed by a laser beam $160_x$. In some embodiments, the laser beam $160_2$ is positioned such that an entirety of a laser spot S1$x$ created by the laser beam $160_x$ is within a perimeter of the first pad $PAD_1$ and fully overlaps with the first pad $PAD_1$ in the plan view. In some embodiments, an edge of the laser spot S1$x$ of the laser beam $160_x$ coincides the edge of the first pad $PAD_1$ in the plan view. The laser spot S1$x$ illuminates the last desired location. In some embodiments, the laser spot S1$x$ of the laser beam $160_x$ partially overlaps with the laser spot S11 of the laser beam $160_1$. In some embodiments, a center of the laser spot S1$x$ is shifted with respect to the center of the laser spot S11 along the circle 170 in a counterclockwise direction. The last laser shot removes a portion of the insulating layers 107 and 108 in the last desired location, extends the opening $OP_1$ toward the first pad $PAD_1$ and exposes the first pad $PAD_1$. Due the non-uniform intensity of the laser beam $160_x$, the extending opening $OP_1$ has sloped sidewalls.

In some embodiments, last laser shots are performed on pads $PAD_2$ to $PAD_{m-1}$ in a similar manner as the last laser shot performed on the first pad $PAD_1$ described above with reference to step 412 and the description is not repeated herein. Subsequently, in step 414, last laser shot is performed on the last desired location over the last pad $PAD_m$ of the package region, with the last desired location being different from desired locations of the previous laser sequences. In some embodiments, the last laser shot is performed by a laser beam $160_x$. In some embodiments, the laser beam $160_x$ is positioned such that an entirety of a laser spot Smx created by the laser beam $160_x$ is within a perimeter of the last pad $PAD_m$ and fully overlaps with the last pad $PAD_m$ in the plan view. In some embodiments, an edge of the laser spot Smx of the laser beam $160_x$ coincides the edge of the last pad $PAD_m$ in the plan view. The laser spot Smx illuminates the last desired location. In some embodiments, the laser spot Smx of the laser beam $160_x$ partially overlaps with the laser spot Sm1 of the laser beam $160_1$. In some embodiments, a center of the laser spot Smx is shifted with respect to the center of the laser spot Sm1 along the circle 170 in the counterclockwise direction. The last laser shot removes a portion of the insulating layers 107 and 108 in the last desired location, extends the opening $OP_m$ toward the last pad $PAD_m$ and exposes the last pad $PAD_m$. Due the non-uniform intensity of the laser beam $160_x$, the extended opening $OP_m$ has sloped sidewalls.

In some embodiments, the number of laser sequences k of the laser drilling process 400 (see FIG. 24) is less than the number of laser sequences n of the laser drilling process 300 (see FIG. 19). Accordingly, the laser drilling process 400 forms openings faster than the laser drilling process 300. In some embodiments, by using the laser drilling process 400, the wafer-per-hour (WPH) yield is improved by about 15% compared to the laser drilling process 300.

Furthermore, during the laser drilling process 400, time between consecutive laser shots that are performed over a pad of a package region is increased, which allows for heat to dissipate between consecutive laser shots. Accordingly, heat accumulation on the pads $PAD_1$ to $PAD_m$ is reduced, which reduces dendrite formation on the pads $PAD_1$ to $PAD_m$ and reduces or avoids delamination between pads $PAD_1$ to $PAD_m$ and adjacent insulating layers 108 and 112. In some embodiments, the time between consecutive laser shots is between about 0.1 sec and about 1 sec. In some embodiments, laser shots of the laser drilling process 400 (see FIG. 24) may also referred as laser pulses. In some embodiments, each laser shot has a power between about 3 W and about 10 W.

As described in greater detail above, during the laser drilling process 400, each laser shot that is performed over a same pad of a package region is performed on a different location, such that a center of each location is shifted with respect to a center of the previous location along the circle 170 in the clockwise direction, and such that the laser shots cover a total area of an intended location where an opening is formed. Such a laser shot mode may be also referred to as a spiral mode. In other embodiments, any laser shot mode may be used as long as the laser shots cover a total area of an intended location where an opening is formed. For example, in a random mode, the laser shots are performed in random locations for each pad, such that the laser shots cover a total area of an intended location where an opening is formed.

Referring further to FIG. 28, each of the openings $OP_1$ to $OP_m$ has a height H2, a width W3 at a top of each of the openings $OP_1$ to $OP_m$, and a width W4 at a bottom of each of the openings $OP_1$ to $OP_m$. A sidewall and a bottom of each of the openings $OP_1$ to $OP_m$ form an angle $\theta_2$. In some embodiments, the height H2 is between about 10 μm and about 80 μm. In some embodiments, the width W3 is between about 200 μm and about 380 μm. In some embodiments, the width W4 is between about 200 μm and about 270 μm. In some embodiments, a ratio of the width W3 to the width W4 (W3/W4) is between about 1.1 and about 1.7. In some embodiments, a ratio of the width W3 to the height H2 (W3/H2) is between about 5 and about 8. In some embodiments, a ratio of the width W4 to the height H2 (W4/H2) is between about 2.5 and about 27. In some embodiments, the angle $\theta_2$ is between about 130 degrees and about 160 degrees.

Figure 29:
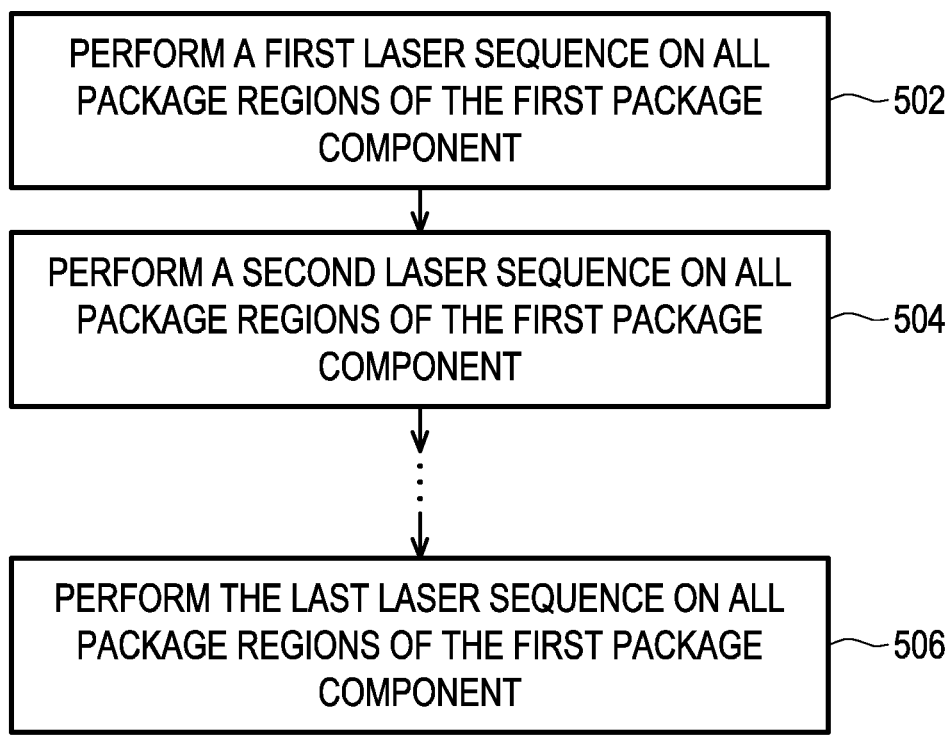
FIG. 29 is a flow diagram illustrating a laser drilling process performed on a package component in accordance with some embodiments.

FIG. 29 is a flow diagram illustrating a laser drilling process 500 performed on the first package component 100 (see FIGS. 15A-15C) in accordance with some embodiments. In some embodiments, the laser drilling process 500 starts with step 502, when a first laser sequence is performed on all package regions $PKG_1$ to $PKG_n$ of the first package component 100. In some embodiments, the first laser sequence may comprise the first laser sequence $302_1$ of the laser drilling process 300 (see FIG. 19) that is performed consecutively on all package regions $PKG_1$ to $PKG_n$. In step 504, a second laser sequence is performed on all package regions $PKG_1$ to $PKG_n$ of the first package component 100. In some embodiments, the second laser sequence may comprise the second laser sequence $302_2$ of the laser drilling process 300 (see FIG. 19) that is performed consecutively on all package regions $PKG_1$ to $PKG_n$.

In some embodiments, after performing the second laser sequence, additional laser sequences are performed on all package regions $PKG_1$ to $PKG_n$ of the first package component 100. In some embodiments, the additional laser sequences may be similar to the first laser sequence of step 502 and the description is not repeated herein. Subsequently, in step 506, the last laser sequence is performed on all package regions $PKG_1$ to $PKG_n$ of the first package component 100. In some embodiments, the last laser sequence may comprise the last laser sequence $302_k$ of the laser drilling process 300 (see FIG. 19) that is performed consecutively on all package regions $PKG_1$ to $PKG_n$.

Referring further to FIG. 29, in alternative embodiments, the first laser sequence of step 502 may comprise the first laser sequence 4021 of the laser drilling process 400 (see FIG. 24) That is performed consecutively on all package regions PKG1 to PKGn of the first package component 100. The second laser sequence of step 504 may comprise the second laser sequence 4022 of the laser drilling process 400 (see FIG. 24) that is performed consecutively on all package regions PKG1 to PKGn of the first package component 100. The last laser sequence of step 506 may comprise the last laser sequence 402x of the laser drilling process 400 (see FIG. 24) That is performed consecutively on all package regions PKG1 to PKGn of the first package component 100. Furthermore, intermediate laser sequences of the laser drilling process 500 that are performed between the second laser sequence and the last laser sequence may be similar to intermediate laser sequences of the laser drilling process 400 that are performed between the second laser sequence 4022 and the last laser sequence 402x.

Figure 30:
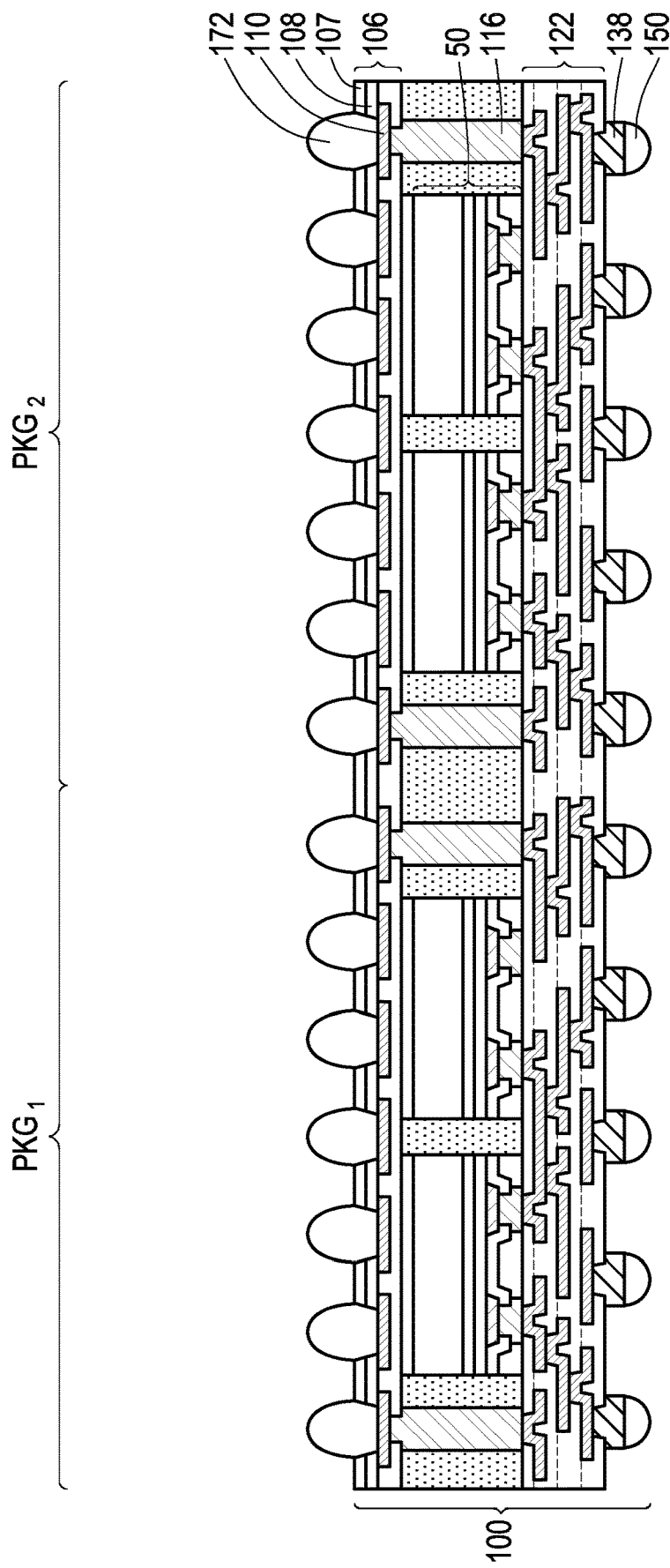
Figure 31:
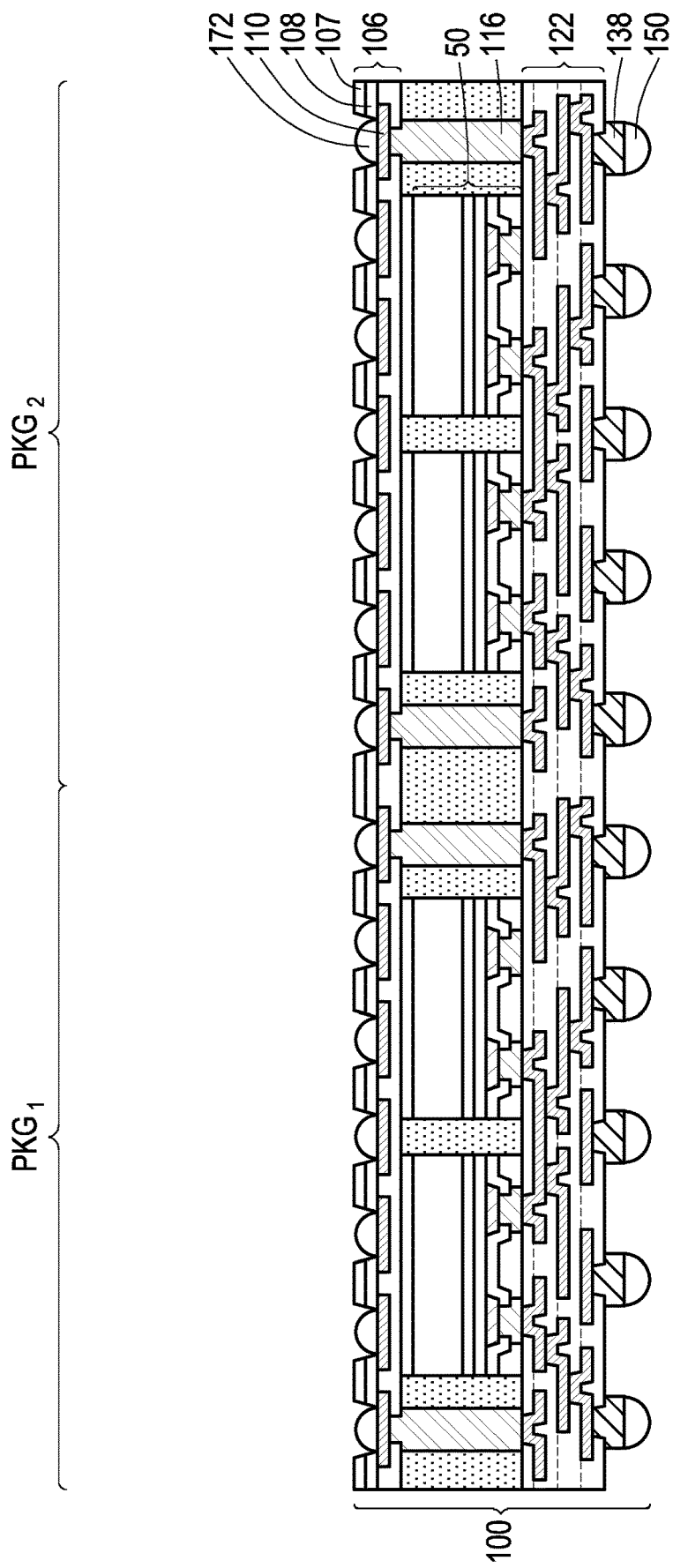
FIG. 31 illustrates a cross-sectional view of a package component in accordance with some embodiments.

In FIG. 30, conductive connectors 172 are formed in the openings $OP_1$ to $OP_m$ (see FIGS. 16A and 16B) to contact the pads $PAD_1$ to $PAD_m$ of the metallization pattern 110. In some embodiments, the conductive connectors 172 comprise flux and are formed in a flux dipping process. In some embodiments, the conductive connectors 172 comprise a conductive paste such as solder paste, silver paste, or the like, and are dispensed in a printing process. In some embodiments, the conductive connectors 172 are formed in a manner similar to the conductive connectors 150, and may be formed of a similar material as the conductive connectors 150. In the illustrated embodiment, the conductive connectors 172 fully fill the openings $OP_1$ to $OP_m$ and extend above a top surface of the insulating layer 107. In other embodiments, the conductive connectors 172 partially fill the openings $OP_1$ to $OP_m$, such that top portions of the conductive connectors 172 are below the top surface of the insulating layer 107 and heights of the conductive connectors 172 are less than height of the openings $OP_1$ to $OP_m$. Such a package component is illustrated in FIG. 31.

Figure 32:
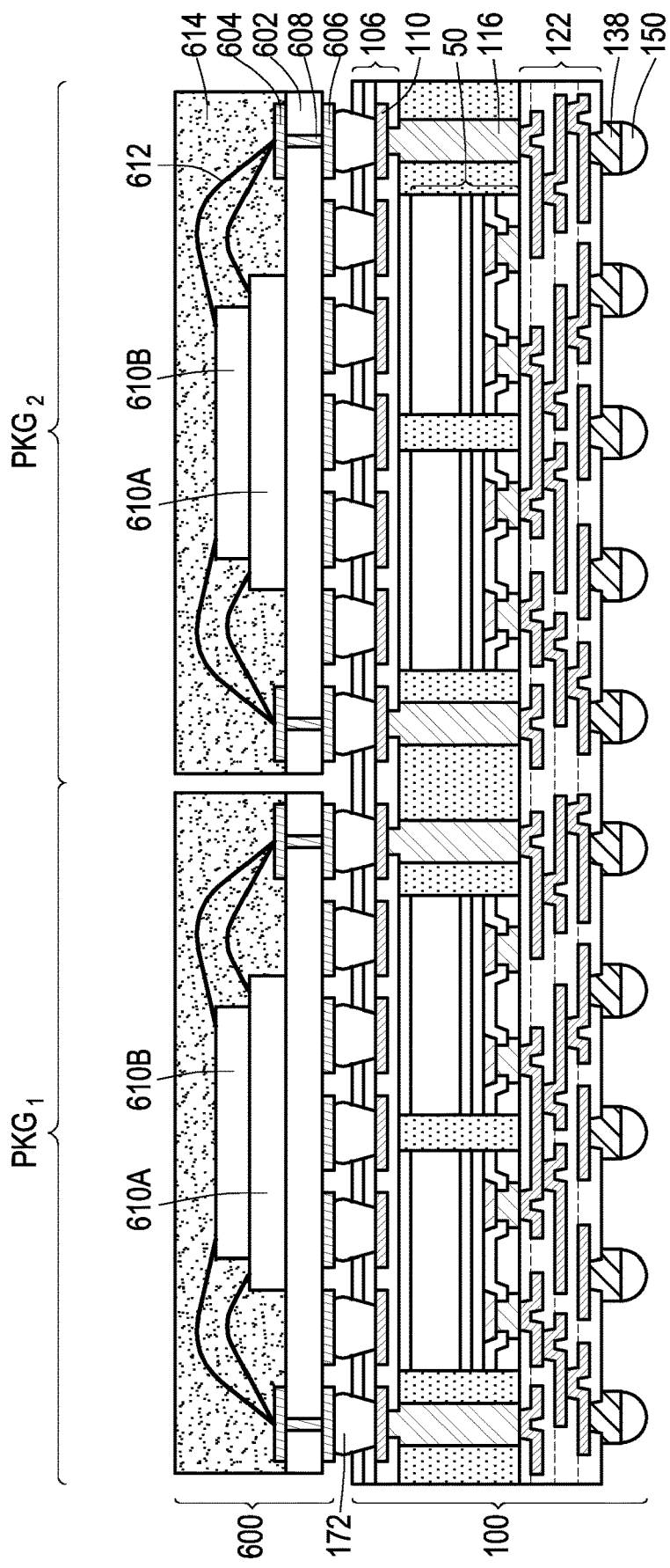
FIGS. 32 and 33 illustrate cross-sectional views of formation and implementation of device stacks in accordance with some embodiments.
Figure 33:
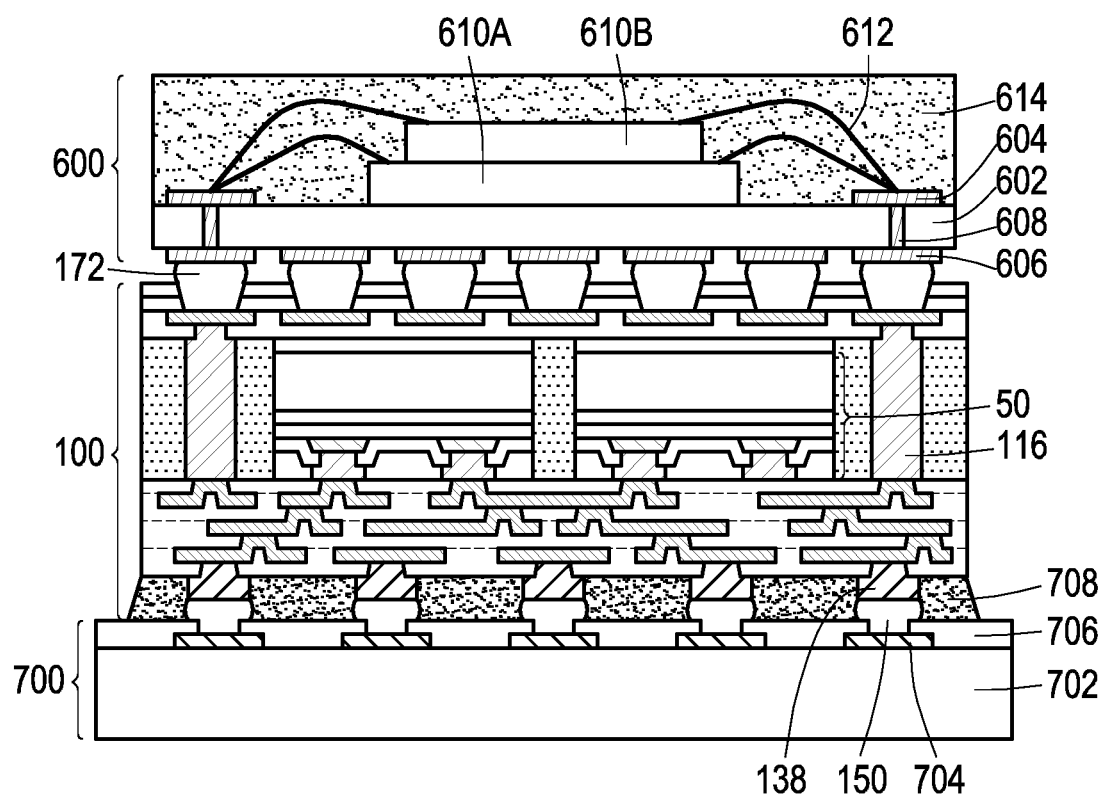

FIGS. 32 and 33 illustrate formation and implementation of device stacks, in accordance with some embodiments. The device stacks are formed from the integrated circuit packages formed in the first package component 100. The device stacks may also be referred to as package-on-package (POP) structures.

In FIG. 32, second package components 600 are coupled to the first package component 100. One of the second package components 600 is coupled in each of the package regions (such as the package region PKG1 and the package regions PKG2) to form an integrated circuit device stack in each package region of the first package component 100.

The second package components 600 include, for example, a substrate 602 and one or more stacked dies 610 (e.g., 610A and 610B) coupled to the substrate 602. Although one set of stacked dies 610 (610A and 610B) is illustrated, in other embodiments, a plurality of stacked dies 610 (each having one or more stacked dies) may be disposed side-by-side coupled to a same surface of the substrate 602. The substrate 602 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 602 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 602 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 602.

The substrate 602 may include active and passive devices (not shown). A wide variety of devices such as transistors, capacitors, resistors, combinations of these, and the like may be used to generate the structural and functional requirements of the design for the second package components 600. The devices may be formed using any suitable methods.

The substrate 602 may also include metallization layers (not shown) and the conductive vias 608. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 602 is substantially free of active and passive devices.

The substrate 602 may have bond pads 604 on a first side of the substrate 602 to couple to the stacked dies 610, and bond pads 606 on a second side of the substrate 602, the second side being opposite the first side of the substrate 602, to couple to the conductive connectors 172. In some embodiments, the bond pads 604 and 606 are formed by forming recesses (not shown) into dielectric layers (not shown) on the first and second sides of the substrate 602. The recesses may be formed to allow the bond pads 604 and 606 to be embedded into the dielectric layers. In other embodiments, the recesses are omitted as the bond pads 604 and 606 may be formed on the dielectric layer. In some embodiments, the bond pads 604 and 606 include a thin seed layer (not shown) made of copper, titanium, nickel, gold, palladium, the like, or a combination thereof. The conductive material of the bond pads 604 and 606 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 604 and 606 is copper, tungsten, aluminum, silver, gold, the like, or a combination thereof.

In some embodiments, the bond pads 604 and the bond pads 606 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 604 and 606. Any suitable materials or layers of material that may be used for the bond pads 604 and 606 are fully intended to be included within the scope of the current application. In some embodiments, the conductive vias 608 extend through the substrate 602 and couple at least one of the bond pads 604 to at least one of the bond pads 606.

In the illustrated embodiment, the stacked dies 610 are coupled to the substrate 602 by wire bonds 612, although other connections may be used, such as conductive bumps. In an embodiment, the stacked dies 610 are stacked memory dies. For example, the stacked dies 610 may be memory dies such as low-power (LP) double data rate (DDR) memory modules, such as LPDDR1, LPDDR2, LPDDR3, LPDDR4, or the like memory modules.

The stacked dies 610 and the wire bonds 612 may be encapsulated by a molding material 614. The molding material 614 may be molded on the stacked dies 610 and the wire bonds 612, for example, using compression molding. In some embodiments, the molding material 614 is a molding compound, a polymer, an epoxy, silicon oxide filler material, the like, or a combination thereof. A curing process may be performed to cure the molding material 614. The curing process may be a thermal curing, a UV curing, the like, or a combination thereof.

In some embodiments, the stacked dies 610 and the wire bonds 612 are buried in the molding material 614, and after the curing of the molding material 614, a planarization step, such as a grinding, is performed to remove excess portions of the molding material 614 and provide a substantially planar surface for the second package components 600.

After the second package components 600 are formed, the second package components 600 are mechanically and electrically bonded to the first package component 100 by way of the conductive connectors 172, the bond pads 606, and the metallization pattern 110 of the back-side redistribution structure 106. In some embodiments, the stacked dies 610 may be coupled to the integrated circuit dies 50 through the wire bonds 612, the bond pads 604 and 606, the conductive vias 608, the conductive connectors 172, the back-side redistribution structure 106, the through vias 116, and the front-side redistribution structure 122.

In some embodiments, a solder resist (not shown) is formed on the side of the substrate 602 opposing the stacked dies 610. The conductive connectors 172 may be disposed in openings in the solder resist to be electrically and mechanically coupled to conductive features (e.g., the bond pads 606) in the substrate 602. The solder resist may be used to protect areas of the substrate 602 from external damage.

In some embodiments, the conductive connectors 172 have an epoxy flux (not shown) formed thereon before they are reflowed with at least some of the epoxy portion of the epoxy flux remaining after the second package components 600 are attached to the first package component 100.

In some embodiments, an underfill (not shown) is formed between the first package component 100 and the second package components 600, surrounding the conductive connectors 172. The underfill may reduce stress and protect the joints resulting from the reflowing of the conductive connectors 172. The underfill may be formed by a capillary flow process after the second package components 600 are attached, or may be formed by a suitable deposition method before the second package components 600 are attached. In embodiments where the epoxy flux is formed, it may act as the underfill.

In FIG. 33, a singulation process is performed by sawing along scribe line regions, e.g., between adjacent ones of the package regions $PKG_1$ to $PKG_n$ (see FIG. 15A). The sawing singulates each of the package regions $PKG_1$ to $PKG_n$ from the rest of the package regions $PKG_1$ to $PKG_n$. The resulting, singulated device stack is from one of the package regions $PKG_1$ to $PKG_n$. In some embodiments, the singulation process is performed after the second package components 600 are coupled to the first package component 100. In other embodiments (not shown), the singulation process is performed before the second package components 600 are coupled to the first package component 100, such as after the carrier substrate 102 is de-bonded and the conductive connectors 172 are formed.

Each singulated first package component 100, with the respective second package component 600 bonded thereon, may then be mounted to a package substrate 700 using the conductive connectors 150. The package substrate 700 includes a substrate core 702 and bond pads 704 over the substrate core 702. The substrate core 702 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 702 may be an SOI substrate. Generally, an SOI substrate includes a layer of a semiconductor material such as epitaxial silicon, germanium, silicon germanium, SOI, SGOI, or combinations thereof. The substrate core 702 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 702.

The substrate core 702 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 702 may also include metallization layers and vias (not shown), with the bond pads 704 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 702 is substantially free of active and passive devices.

In some embodiments, the conductive connectors 150 are reflowed to attach the first package component 100 to the bond pads 704. The conductive connectors 150 electrically and/or physically couple the package substrate 700, including metallization layers in the substrate core 702, to the first package component 100. In some embodiments, a solder resist 706 is formed on the substrate core 702. The conductive connectors 150 may be disposed in openings in the solder resist 706 to be electrically and mechanically coupled to the bond pads 704. The solder resist 706 may be used to protect areas of the substrate core 702 from external damage.

The conductive connectors 150 may have an epoxy flux (not shown) formed thereon before they are reflowed with at least some of the epoxy portion of the epoxy flux remaining after the first package component 100 is attached to the package substrate 700. This remaining epoxy portion may act as an underfill to reduce stress and protect the joints resulting from reflowing the conductive connectors 150. In some embodiments, an underfill 708 may be formed between the first package component 100 and the package substrate 700 and surrounding the conductive connectors 150. The underfill 708 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 700 (e.g., to the bond pads 704). For example, the passive devices may be bonded to a same surface of the first package component 100 or the package substrate 700 as the conductive connectors 150. The passive devices may be attached to the package component 100 prior to mounting the first package component 100 on the package substrate 700, or may be attached to the package substrate 700 prior to or after mounting the first package component 100 on the package substrate 700.

The first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 700, but the second package component 600 is omitted. Instead, a lid or heat spreader may be attached to the first package component 100. When the second package component 600 is omitted, the back-side redistribution structure 106 and through vias 116 may also be omitted.

Figure 34:
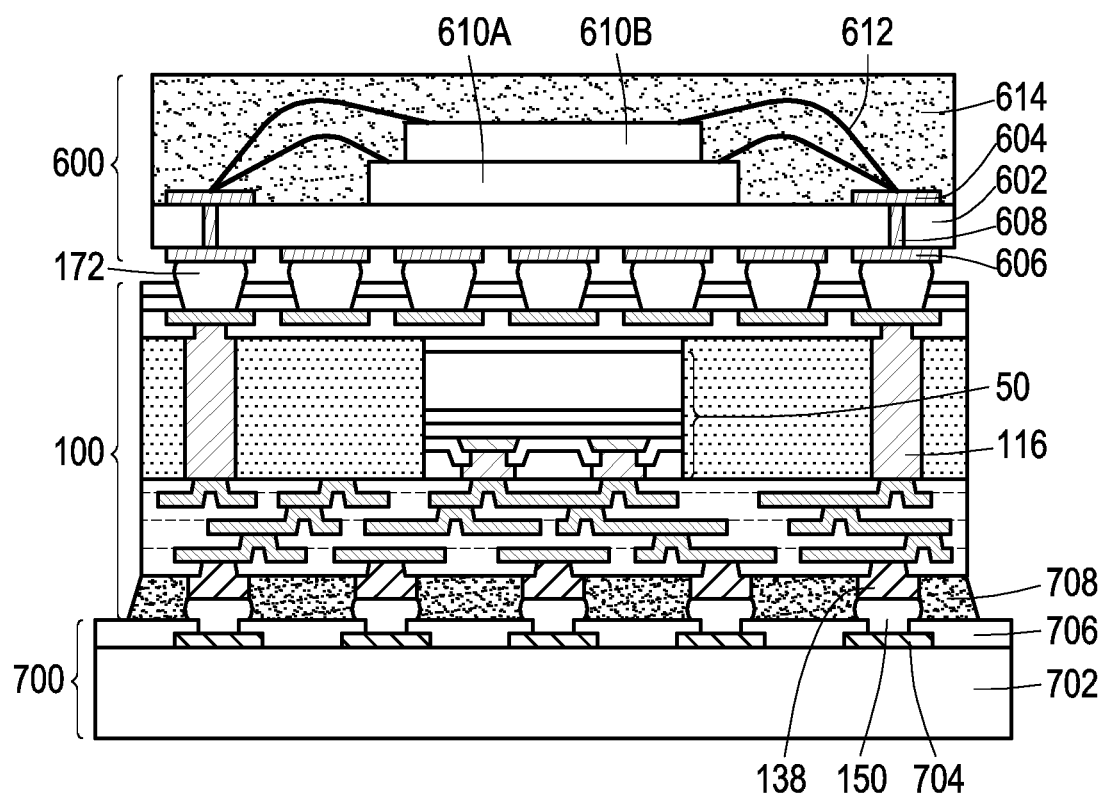
FIG. 34 illustrates a cross-sectional views of a device stack in accordance with some embodiments.

Further in FIG. 33, in the illustrated embodiment, the singulated first package component 100 comprises two integrated circuit dies 50. In other embodiments, the singulated first package component 100 may comprise one or more than two integrated circuit dies 50. For example, the device stack illustrated in FIG. 34 includes a singulated first package component 100 comprising one integrated circuit die 50.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The laser drilling process described above allows for reducing heat accumulation on pads of the redistribution structure by increasing time between two consecutive laser shots that are performed over a same pad, reducing dendrite formation on the pads by reducing heat accumulation on the pads, reducing or avoiding delamination between pads and adjacent insulating layers, increasing wafer-per-hour (WPH) yield by reducing number of laser shots that form the openings over the pads, and increasing pass rate for a reliability analysis (RA) torture test.

In accordance with an embodiment, a method includes forming an insulating layer over a package. The package has a plurality of locations where openings are subsequently formed. A first laser shot is performed, location by location, on each of the locations across the package. A first laser spot of the first laser shot overlaps with each of the locations. The first laser shot removes a first portion of the insulating layer below the first laser spot. Another laser shot is performed, location by location, on each of the locations across the package. Another laser spot of the another laser shot overlaps with each of the locations. The another laser shot removes another portion of the insulating layer below the another laser spot. Performing the another laser shot, location by location, on each of the locations across the package is repeated multiple times, until desired portions of the insulating layer are removed. In an embodiment, the first laser spot fully overlaps with the another laser spot. In an embodiment, the first laser spot partially overlaps with the another laser spot. In an embodiment, the package includes a plurality of pads in the plurality of locations. In an embodiment, the first laser spot overlaps with each of the pads. In an embodiments, the another laser spot overlaps with each of the pads. In an embodiment, each of the openings exposes a respective pad.

In accordance with another embodiment, a method includes forming a package. The package includes pads and an insulating layer over the pads. Laser sequences are performed on the package to form openings in the insulating layer. Each of the openings exposes a respective pad. The performing the laser sequences includes performing a first laser sequence on the package. Performing the first laser sequence includes performing a first laser shot on the insulating layer over each of the pads consecutively. A first laser spot of the first laser shot overlaps with each of the pads in a plan view. The first laser shot removes a first portion of the insulating layer below the first laser spot. Subsequent laser sequences are performed on the package. Performing each of the subsequent laser sequences includes performing a subsequent laser shot on the insulating layer over each of the pads consecutively. A subsequent laser spot of the subsequent laser shot overlaps with each of the pads in the plan view. The subsequent laser spot of the subsequent laser shot overlaps with a previous laser spot of a previous laser shot. The subsequent laser shot removes a subsequent portion of the insulating layer below the subsequent laser spot. In an embodiment, the subsequent laser spot of the subsequent laser shot fully overlaps with the previous laser spot of the previous laser shot. In an embodiment, the subsequent laser spot of the subsequent laser shot partially overlaps with the previous laser spot of the previous laser shot. In an embodiment, an edge of the first laser spot coincides with an edge of each of the pads in the plan view. In an embodiment, an edge of the subsequent laser spot coincides with an edge of each of the pads in the plan view. In an embodiment, the openings have sloped sidewalls. In an embodiment, the first laser spot and all of the subsequent laser spots cover an area of each of the openings in the plan view.

In accordance with yet another embodiment, a method includes forming a redistribution structure. The redistribution structure includes pads and an insulating layer over the pads. The insulating layer is patterned to form openings in the insulating layer. Each of the openings exposes a respective pad. The patterning the insulating layer includes performing a first laser sequence on the insulating layer. Performing the first laser sequence includes performing first laser shots on first locations of the insulating layer. Each first location overlaps with a respective pad in a plan view. Each first laser shot removes a first portion of the insulating layer from a respective first location. Subsequent laser sequences are performed on the insulating layer. Performing each subsequent laser sequence includes performing subsequent laser shots on subsequent locations of the insulating layer. Each subsequent location overlaps with a respective pad in the plan view. Each subsequent laser shot removes a subsequent portion of the insulating layer from a respective subsequent location. Each subsequent location partially overlaps with a respective previous location of a previous laser sequence in the plan view. In an embodiment, the first locations are same as the subsequent locations. In an embodiment, the first locations are different from the subsequent locations. In an embodiment, each of the openings has sloped sidewalls. In an embodiment, the method further includes forming conductive connectors in the openings. In an embodiment, top portions of the conductive connectors are below a top surface of the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an insulating layer over a package, wherein the package has a plurality of locations where openings are subsequently formed;
   performing a first laser shot, location by location, on each of the locations across the package, wherein a first laser spot of the first laser shot overlaps with each of the locations, and wherein the first laser shot removes a first portion of the insulating layer below the first laser spot;

performing another laser shot, location by location, on each of the locations across the package, wherein another laser spot of the another laser shot overlaps with each of the locations, and wherein the another laser shot removes another portion of the insulating layer below the another laser spot; and repeating performing the another laser shot, location by location, on each of the locations across the package multiple times, until desired portions of the insulating layer are removed.

2. The method of claim 1, wherein the first laser spot fully overlaps with the another laser spot.

3. The method of claim 1, wherein the first laser spot partially overlaps with the another laser spot.

4. The method of claim 1, wherein the package comprises a plurality of pads in the plurality of locations.

5. The method of claim 4, wherein the first laser spot overlaps with each of the pads.

6. The method of claim 4, wherein the another laser spot overlaps with each of the pads.

7. The method of claim 4, wherein each of the openings exposes a respective pad.

8. A method comprising:

forming a package, the package comprising pads and an insulating layer over the pads; and performing laser sequences on the package to form openings in the insulating layer, each of the openings exposing a respective pad, wherein the performing the laser sequences comprises:

performing a first laser sequence on the package, wherein performing the first laser sequence comprises performing a first laser shot on the insulating layer over each of the pads consecutively, wherein a first laser spot of the first laser shot overlaps with each of the pads in a plan view, and wherein the first laser shot removes a first portion of the insulating layer below the first laser spot; and after performing the first laser sequence, performing subsequent laser sequences on the package, wherein performing each of the subsequent laser sequences comprises performing a subsequent laser shot on the insulating layer over each of the pads consecutively, wherein a subsequent laser spot of the subsequent laser shot overlaps with each of the pads in the plan view, wherein the subsequent laser spot of the subsequent laser shot overlaps with a previous laser spot of a previous laser shot, and wherein the subsequent laser shot removes a subsequent portion of the insulating layer below the subsequent laser spot.

9. The method of claim 8, wherein the subsequent laser spot of the subsequent laser shot fully overlaps with the previous laser spot of the previous laser shot in a plan view.

10. The method of claim 8, wherein the subsequent laser spot of the subsequent laser shot and the previous laser spot of the previous laser shot only partially overlaps each other in a plan view.

11. The method of claim 8, wherein an edge of the first laser spot coincides with an edge of each of the pads in the plan view.

12. The method of claim 8, wherein an edge of the subsequent laser spot coincides with an edge of each of the pads in the plan view.

13. The method of claim 8, wherein the openings have sloped sidewalls.

14. The method of claim 8, wherein the first laser spot and all of the subsequent laser spots cover an area of each of the openings in the plan view.

15. A method comprising:

forming a redistribution structure, the redistribution structure comprising pads and an insulating layer over the pads; and patterning the insulating layer to form openings in the insulating layer, each of the openings exposing a respective pad, wherein the patterning the insulating layer comprises:

performing a first laser sequence on the insulating layer, wherein performing the first laser sequence comprises performing first laser shots on first locations of the insulating layer, wherein each first location overlaps with a respective pad in a plan view, and wherein each first laser shot removes a first portion of the insulating layer from a respective first location; and after performing the first laser sequence, performing a plurality of subsequent laser sequences on the insulating layer, wherein performing each subsequent laser sequence comprises performing subsequent laser shots on subsequent locations of the insulating layer, wherein each subsequent location overlaps with a respective pad in the plan view, wherein each subsequent laser shot removes a subsequent portion of the insulating layer from a respective subsequent location, and wherein each subsequent location partially overlaps with a respective previous location of a previous laser sequence in the plan view.

16. The method of claim 15, wherein the first locations are same as the subsequent locations.

17. The method of claim 15, wherein the first locations are different from the subsequent locations.

18. The method of claim 15, wherein each of the openings has sloped sidewalls.

19. The method of claim 15, further comprising forming conductive connectors in the openings.

20. The method of claim 19, wherein top portions of the conductive connectors are below a top surface of the insulating layer.

\* \* \* \* \*